(12) United States Patent
Kanno

(10) Patent No.: US 12,114,502 B2
(45) Date of Patent: Oct. 8, 2024

(54) SEMICONDUCTOR STORAGE DEVICE

(71) Applicant: KIOXIA CORPORATION, Tokyo (JP)

(72) Inventor: Hiroshi Kanno, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/335,198

(22) Filed: Jun. 15, 2023

(65) Prior Publication Data

US 2023/0328992 A1 Oct. 12, 2023

Related U.S. Application Data

(63) Continuation of application No. 17/715,541, filed on Apr. 7, 2022, now Pat. No. 11,723,204, which is a
(Continued)

(30) Foreign Application Priority Data

Aug. 29, 2019 (JP) .................................. 2019-157156

(51) Int. Cl.
*H10B 43/27* (2023.01)
*H01L 29/10* (2006.01)

(52) U.S. Cl.
CPC ......... *H10B 43/27* (2023.02); *H01L 29/1041* (2013.01)

(58) Field of Classification Search
CPC ........ H10B 43/27; H10B 43/10; H10B 43/20; H10B 43/35; H10B 41/10; H10B 41/20; H10B 41/27; H10B 41/35; H10B 41/40; H10B 41/41; H01L 29/0684; H01L 29/1041; H01L 29/40117; H01L 29/40114;
(Continued)

(56) References Cited

U.S. PATENT DOCUMENTS 9,520,407 B2 12/2016 Fukuzumi et al.
9,627,405 B1 4/2017 Lee
(Continued)

FOREIGN PATENT DOCUMENTS

KR 2020120112 A 10/2020
TW 201021202 A1 6/2010
TW 201539724 A 10/2015

*Primary Examiner* — Natalia A Gondarenko
(74) *Attorney, Agent, or Firm* — Oblon, McClelland, Maier & Neustadt, L.L.P.

(57) ABSTRACT

The semiconductor storage device of an embodiment includes a first conductive layer, a stack disposed above the first conductive layer and including a plurality of second conductive layers in a first direction, and a columnar body that extends in the first direction through the stack, and includes a semiconductor layer and a charge storage film provided between the plurality of conductive layers and the semiconductor layer. A first conductive layer out of the plurality of conductive layers is connected to the semiconductor layer, and the semiconductor layer includes a first region in which a concentration of an n-type impurity is higher than a concentration of a p-type impurity, a second region in which a concentration of a p-type impurity is higher than a concentration of an n-type impurity, and a third region contacted to the first conductive layer and disposed closer to the first region than the second region in the first direction.

14 Claims, 21 Drawing Sheets

Related U.S. Application Data continuation of application No. 16/808,450, filed on Mar. 4, 2020, now abandoned.

(58) Field of Classification Search
CPC ........... H01L 29/66833; H01L 27/1052; H01L 27/1085; H01L 27/10855; H01L 27/1128; H01L 27/11548; H01L 27/11507; H01L 27/1157; H01L 27/11573; H01L 27/11575; H01L 27/1159; H01L 27/1524; H01L 27/11521; H01L 27/11529; H01L 27/11524; H01L 27/11556; H01L 27/11578; H01L 27/11582; H01L 23/481; H01L 23/485; H01L 23/4855; H01L 23/522–53295; H01L 23/5384
USPC ......... 257/314, 315, 324, E27.098, E29.255, 257/E29.3
See application file for complete search history.

(56) References Cited

U.S. PATENT DOCUMENTS

| | | |
|---|---|---|
| 10,199,359 B1 | 2/2019 | Sakakibara |
| 10,629,613 B1 | 4/2020 | Shimizu et al. |
| 2010/0117137 A1 | 5/2010 | Fukuzumi et al. |
| 2010/0320528 A1 | 12/2010 | Jeong et al. |
| 2015/0097222 A1 | 4/2015 | Lee et al. |
| 2019/0067317 A1* | 2/2019 | Shioda .................... H01L 29/36 |
| 2019/0296046 A1 | 9/2019 | Arai |
| 2019/0355742 A1 | 11/2019 | Maruyama et al. |
| 2020/0020774 A1 | 1/2020 | Lee |
| 2020/0098782 A1 | 3/2020 | Nojima et al. |
| 2020/0328226 A1 | 10/2020 | Park |

* cited by examiner

SEMICONDUCTOR STORAGE DEVICE

CROSS-REFERENCE TO RELATED APPLICATIONS

This application is a continuation of and claims benefit under 35 U.S.C. § 120 to U.S. application Ser. No. 17/715,541, filed Apr. 7, 2022, which is a continuation of and claims benefit under 35 U.S.C. § 120 to U.S. application Ser. No. 16/808,450, filed Mar. 4, 2020, which is based upon and claims the benefit of priority under 35 U.S.C. § 119 from Japanese Patent Application No. 2019-157156, filed Aug. 29, 2019, the entire contents of each of which are incorporated herein by reference.

FIELD

An embodiment of the present invention relates to a semiconductor storage device.

BACKGROUND

A NAND-type flash memory in which memory cells are laminated three-dimensionally is known.

Patent Document

[Patent Document 1] Specification of U.S. Pat. No. 9,520,407

DETAILED DESCRIPTION

Figure 1:
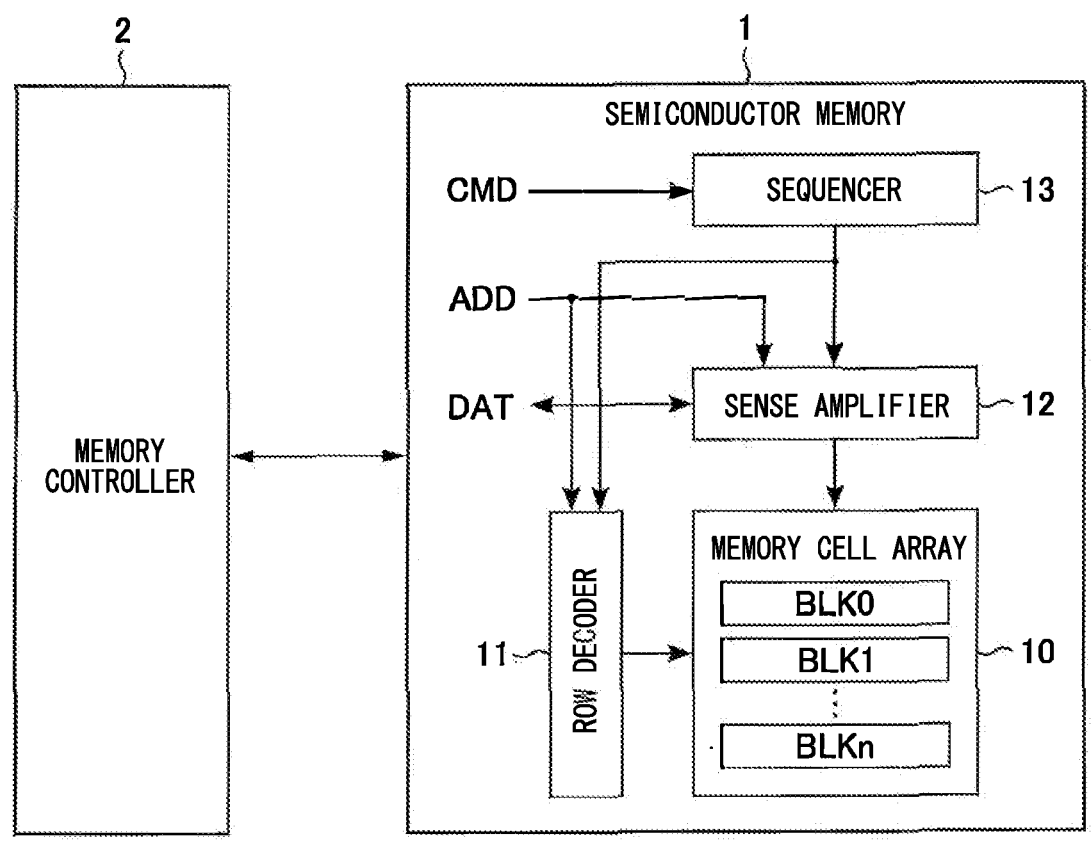
FIG. 1 is a block diagram illustrating a circuit configuration of a semiconductor storage device according to a first embodiment.

A semiconductor storage device of an embodiment includes: a first conductive layer; a stack disposed above the first conductive layer and including a plurality of second conductive layers stacked in a first direction; and a columnar body that extends in the first direction through the stack, and includes a semiconductor layer and a charge storage film disposed between the plurality of conductive layers and the semiconductor layer. The first conductive layer is in contact with the semiconductor layer. The semiconductor layer includes a first region in which a concentration of an n-type impurity is higher than a concentration of a p-type impurity, a second region in which a concentration of the p-type impurity is higher than a concentration of the n-type impurity, and a third region contacted to the first conductive layer and disposed closer to the first region than the second region in the first direction.

Hereinafter, a semiconductor storage device of an embodiment will be described with reference to the accompanying drawings. In the following description, components having the same or similar functions are denoted by the same reference numerals and signs. Repeated description of these components may be omitted. The drawings are schematic or conceptual, and a relationship between the thickness and the width of each portion, a size ratio between the components, and the like are not necessarily identical to those in reality. In the present specification, the term "connection" is not limited to a case of physical connection, and also includes a case of electrical connection. In the present specification, the wording "extend in an A direction" means that, for example, dimensions in an A direction are larger than the smallest dimensions out of respective dimensions in an X direction, a Y direction, and a Z direction to be described later. The "A direction" is any direction.

In addition, first, the X direction, the Y direction, the Z direction will be defined. The X direction and the Y direction are directions that are approximately parallel to the surface of a substrate to be described later (see FIG. 1). The X direction is a direction in which a slit to be described later extends. The Y direction is a direction that intersects (that is, for example, approximately orthogonal to) the X direction. The Z direction is a direction that intersects (that is, for example, approximately orthogonal to) the X direction and the Y direction and is away from a substrate 30. These expressions are for convenience only, and do not specify the direction of gravity. In the present embodiment, the Z direction is an example of a "first direction."

First Embodiment

FIG. 1 is a block diagram illustrating a system configuration of a semiconductor memory 1. The semiconductor memory 1 is a non-volatile semiconductor storage device, and is, for example, a NAND-type flash memory. The semiconductor memory 1 includes, for example, a memory cell array 10, a row decoder 11, a sense amplifier 12, and a sequencer 13.

The memory cell array 10 includes a plurality of blocks BLK0 to BLKn (n is an integer equal to or greater than 1). The block BLK is a set of non-volatile memory cell transistors MT (see FIG. 2). The memory cell array 10 is disposed with a plurality of bit lines and a plurality of word lines. Each of the memory cell transistors MT is connected to one bit line and one word line. The detailed configuration of the memory cell array will be described later.

The row decoder 11 selects one block BLK on the basis of address information ADD received from an external memory controller 2. The row decoder 11 applies a desired voltage to each of the plurality of word lines, to thereby control a write operation and a read operation of data for the memory cell array 10.

The sense amplifier 12 applies a desired voltage to each bit line in accordance with write data DAT received from the memory controller 2. The sense amplifier 12 determines data stored in the memory cell transistor MT on the basis of the voltage of a bit line, and transmits the determined read data DAT to the memory controller 2.

The sequencer 13 controls the operation of the entirety of the semiconductor memory 1 on the basis of a command CMD received from the memory controller 2.

A combination of the semiconductor memory 1 and the memory controller 2 described above may constitute one semiconductor device. The semiconductor device is a memory card such as, for example, an SD (registered trademark) card, a solid-state drive (SSD), or the like.

Figure 2:
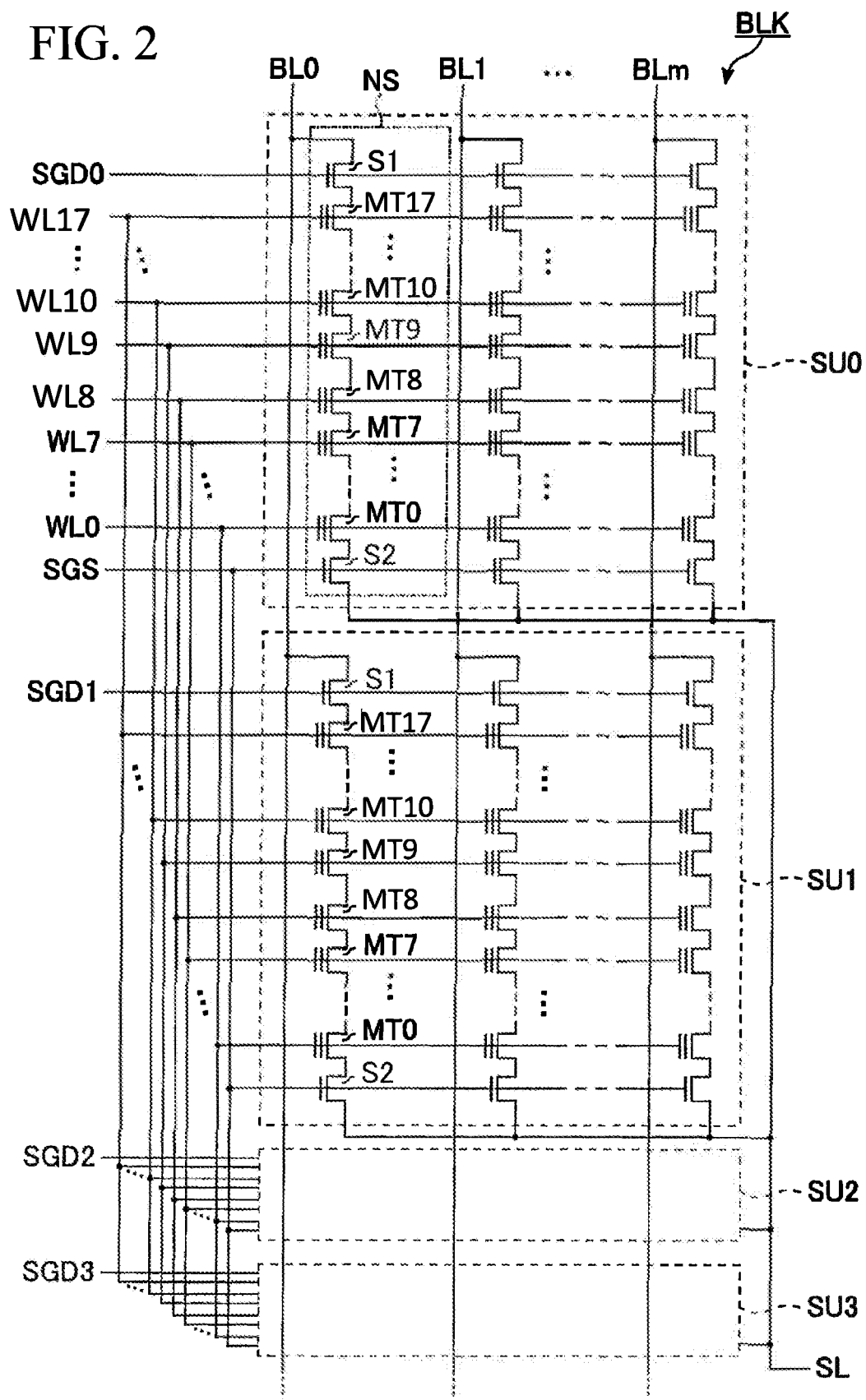
FIG. 2 is a circuit diagram of a memory cell array of the semiconductor storage device according to the first embodiment.

Next, the electrical configuration of the memory cell array 10 will be described. FIG. 2 is a diagram illustrating an equivalent circuit of the memory cell array 10, and shows one extracted block BLK. The block BLK includes a plurality of (for example, four) string units SU0 to SU3.

Each of the string units SU0 to SU3 is a set of a plurality of NAND strings NS. One end of each NAND string NS is connected to any of bit lines BL0 to BLm (m is an integer equal to or greater than 1). The other end of each NAND string NS is connected to a source line SL. NAND string NS respectively includes a plurality of (for example, eighteen) memory cell transistors MT0 to MT17, a first selection transistor 51, and a second selection transistor S2.

The plurality of memory cell transistors MT0 to MT17 are electrically connected to each other in series. The memory cell transistor MT includes a control gate and a charge storage film, and stores data in a non-volatile manner. The memory cell transistor MT stores charges in the charge storage film in accordance with a voltage applied to the control gate. The control gate of the memory cell transistor MT is connected to any of corresponding word lines WL0 to WL17. The memory cell transistor MT is electrically connected to the row decoder 11 through the word line WL.

The first selection transistor S1 in each NAND string NS is connected between the plurality of memory cell transistors MT0 to MT17 and any of the bit lines BL0 to BLm. The drain of the first selection transistor S1 is connected to any of the bit lines BL0 to BLm. The source of the first selection transistor S1 is connected to the memory cell transistor MT17. The control gate of the first selection transistor S1 in each NAND string NS is connected to any of selection gate lines SGD0 to SGD3. The first selection transistor S1 is electrically connected to the row decoder 11 through the selection gate line SGD. When a predetermined voltage is applied to any of the selection gate lines SGD0 to SGD3, the first selection transistor S1 connects the NAND string NS and the bit lines BL.

The second selection transistor S2 in each NAND string NS is connected between the plurality of memory cell transistors MT0 to MT17 and the source line SL. The drain of the second selection transistor S2 is connected to the memory cell transistor MT0. The source of the second selection transistor S2 is connected to the source line SL. The control gate of the second selection transistor S2 is connected to a selection gate line SGS. The second selection transistor S2 is electrically connected to the row decoder 11 through the selection gate line SGS. When a predetermined voltage is applied to the selection gate line SGS, the second selection transistor S2 connects the NAND string NS and the source line SL.

Figure 3:
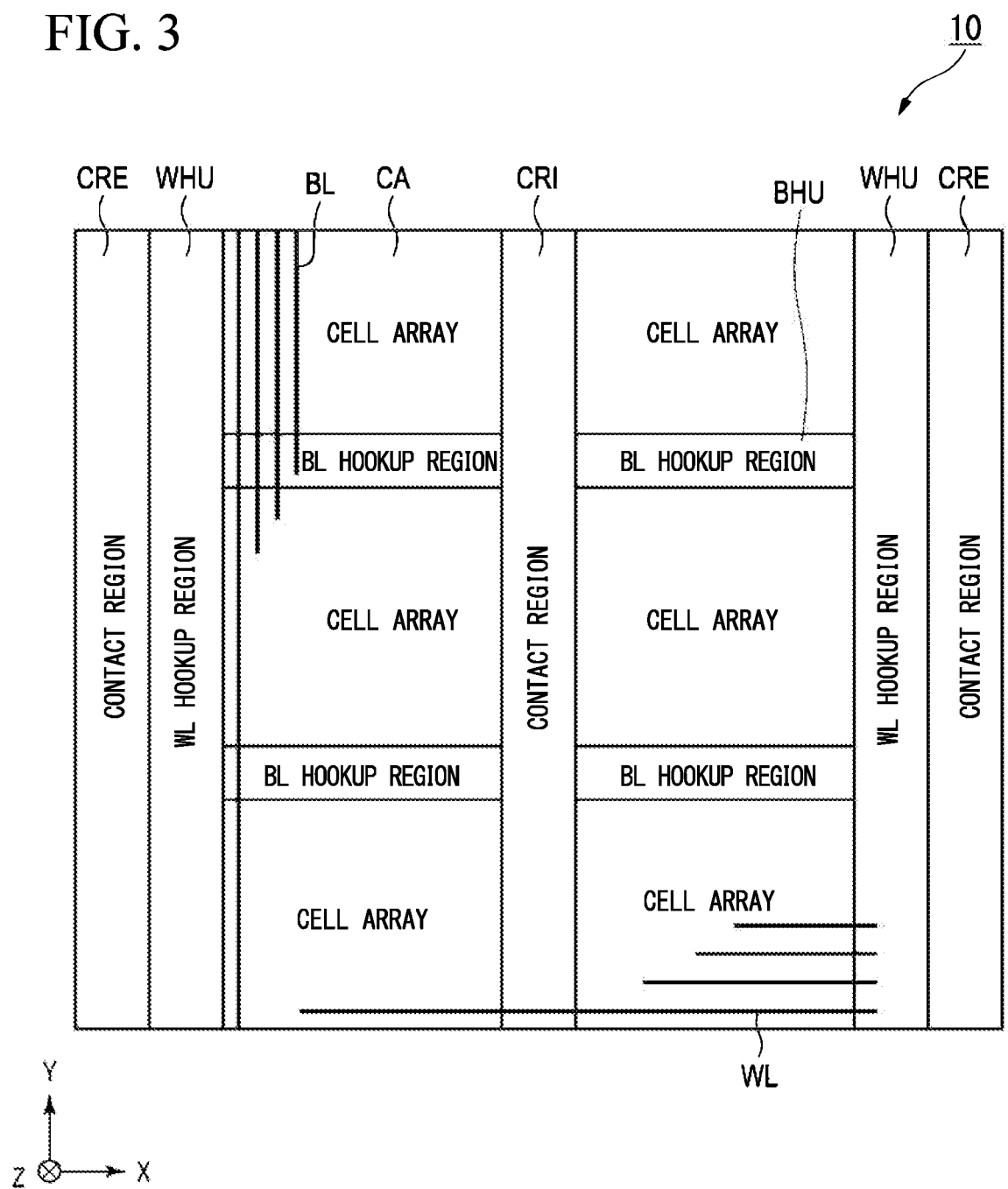
FIG. 3 is a layout diagram of the semiconductor storage device according to the first embodiment.

Next, the structure of the memory cell array 10 will be described. FIG. 3 is a layout diagram of a memory cell array of a semiconductor storage device according to a first embodiment. The memory cell array 10 includes a cell array region CA, a bit line hookup region BHU, a word line hookup region WHU, a contact region CRI, and a contact region CRE.

The number of cell array regions CA is plural, and the cell array regions CA are arranged in a matrix in the X direction and the Y direction. The bit line hookup region BHU is disposed between the cell array regions CA adjacent to each other in the Y direction. The word line hookup region WHU extends in the Y direction, and is disposed at the end portion of the cell array regions CA in the X direction. The contact region CRE extends in the Y direction, and is disposed on the opposite side to the cell array regions CA with reference to the word line hookup region WHU. The contact region CRI extends in the Y direction, and is disposed between the cell array regions CA and the bit line hookup regions BHU which are adjacent to each other in the X direction.

A plurality of bit lines BL extending in the Y direction are arranged above the bit line hookup regions BHU and the cell array regions CA in the X direction. Further, a plurality of word lines WL extending in the X direction are arranged above the word line hookup region WHU in the Y direction.

Figure 4:
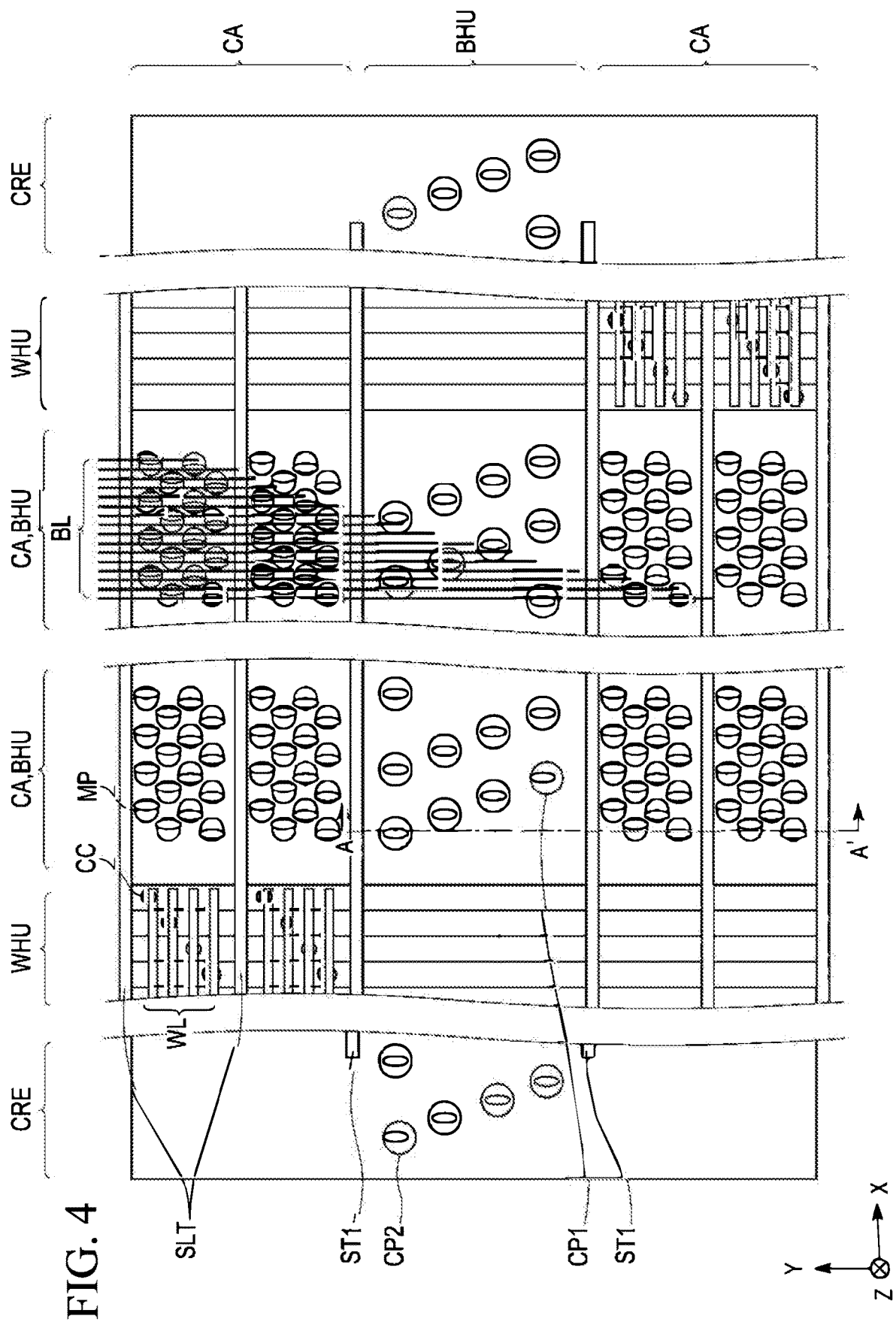
FIG. 4 is a plan view of the vicinity of a cell array region according to the first embodiment.

Next, the planar structure of a feature portion of the memory cell array 10 will be described. FIG. 4 is a plan view of the vicinity of the cell array regions CA. FIG. 4 is an enlarged plan view of the vicinity of two cell array regions CA between which the bit line hookup region BHU is interposed in the Y direction.

A slit ST1 is between the bit line hookup region BHU and each of the cell array regions CA. The slit ST1 electrically isolates the cell array region CA from the bit line hookup region BHU. The slit ST1 extends in the X direction and the Z direction. The slit ST1 divides the memory cell array 10 into a plurality of blocks BLK0 to BLKn.

Each of the cell array regions CA is with a plurality of memory pillars MP and slits SLT. In the present embodiment, the memory pillars MP are an example of a "columnar body." The memory pillars MP are dotted within the cell array region CA. The plurality of memory pillars MP are disposed, for example, in a staggered form. The slits SLT extend in the X direction and the Z direction. The slits SLT divide the plurality of memory pillars MP within the cell array region CA in the Y direction.

The word line hookup region WHU is with a plurality of contact plugs CC. Each of the contact plugs CC is electrically connected to a plurality of word lines WL disposed above the contact plug CC.

The bit line hookup region BHU is with a plurality of contact plugs CP1. The plurality of contact plugs CP1 are dotted within the bit line hookup region BHU. Each of the contact plugs CP1 is electrically connected to a plurality of bit lines BL. Each of the bit lines BL is electrically connected to any of the memory pillars MP and the contact plugs CP1.

The contact region CRE is with a plurality of contact plugs CP2. The contact plug CP2 is electrically connected to an interconnection layer (not shown) which is another layer.

Figure 5:
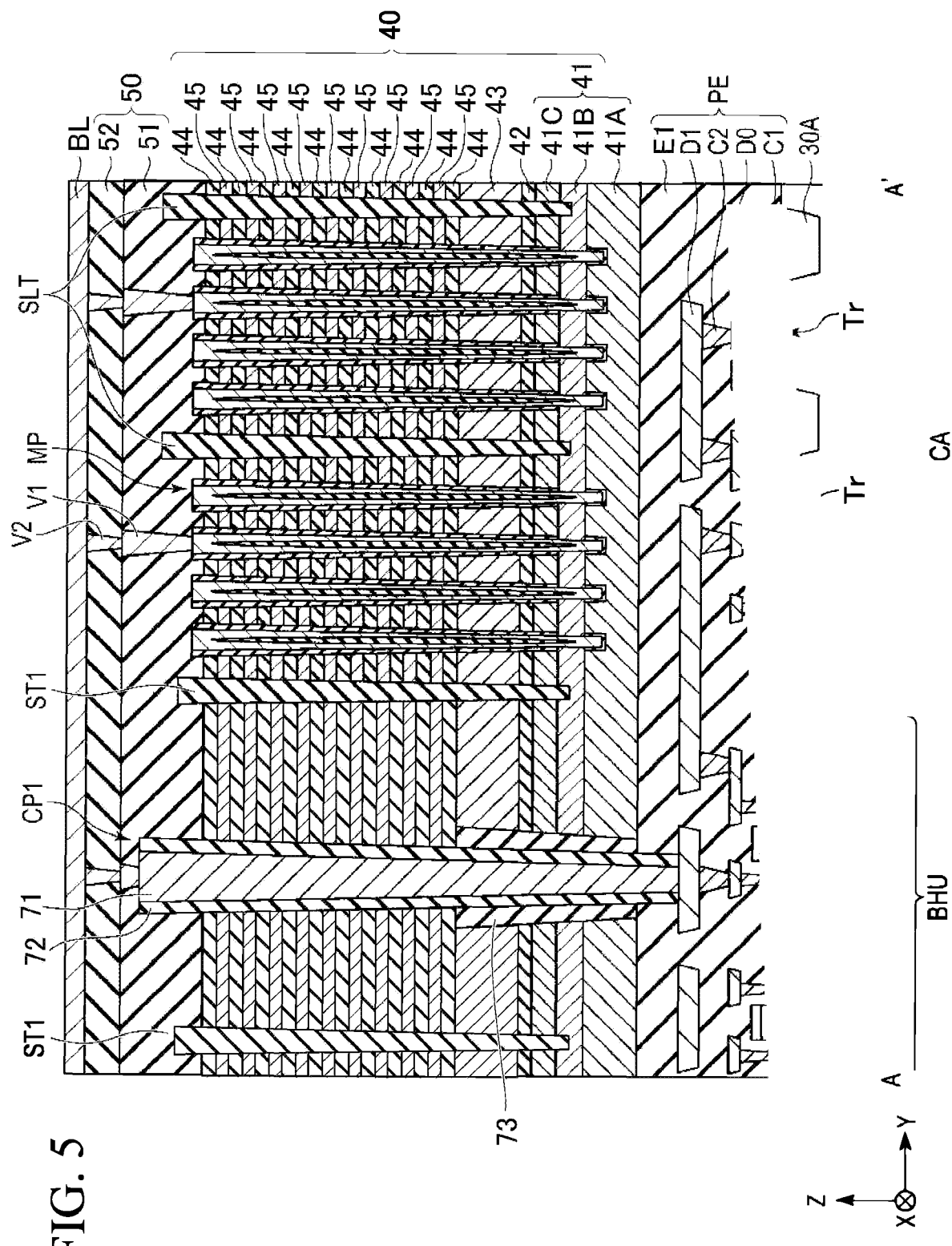
FIG. 5 is a cross-sectional view along plane A-A' in FIG. 4.

Next, the cross-sectional structure of a feature portion of the memory cell array will be described. FIG. 5 is a cross-sectional view along plane A-A' in FIG. 4.

The memory cell array 10 shown in FIG. 5 includes the substrate 30, a circuit layer PE, a stack 40, a cover insulating layer 50, the bit line BL, the memory pillar MP, the contact plug CP1, the slits ST1 and SLT, and vias V1 and V2.

The substrate 30 is, for example, a silicon substrate. There is a plurality of element isolation regions 30A in the surface region of the substrate 30. The element isolation regions 30A contain, for example, a silicon oxide. There are the source region and the drain region of a transistor Tr between the element isolation regions 30A adjacent to each other.

The circuit layer PE is on the substrate 30. The circuit layer PE includes the row decoder 11, the sense amplifier 12, and the sequencer 13 of the semiconductor memory 1. The circuit layer PE includes, for example, a plurality of transistors Tr, a plurality of interconnection layers D0 and D1, and a plurality of vias C1 and C2. The plurality of transistors Tr, the plurality of interconnection layers D0 and D1, and the plurality of vias C1 and C2 are disposed within an insulating layer E1. The insulating layer E1 contains, for example, a silicon oxide. The via C1 connects the source region or the drain region of the transistor Tr and the interconnection layer D0. The via C2 connects the gate region of the transistor Tr and the interconnection layer D1. Each of the interconnection layer D0 and the interconnection layer D1 extends in the X direction and the Y direction. The interconnection layer D1 is connected to the contact plug CP1. The vias C1 and C2 and the interconnection layers D0 and D1 contain, for example, tungsten.

The stack 40 includes a plurality of conductive layers 41, 43, and 45 and a plurality of insulating layers 42 and 44 in the Z direction. The conductive layers 41, 43, and 45 and the insulating layers 42 and 44 are alternately laminated. The plurality of conductive layers 41, 43, and 45 extend in the X direction and the Y direction. The plurality of insulating layers 42 and 44 extend in the X direction and the Y direction.

The conductive layer 41 is closest to the circuit layer PE among a plurality of conductive layers. The conductive layer 41 is an example of a first conductive layer. The conductive layer 41 includes semiconductor layers 41A, 41B, and 41C. The semiconductor layer 41A is on the circuit layer PE. The semiconductor layer 41B is on the semiconductor layer 41A. The semiconductor layer 41C is on the semiconductor layer 41B. The details of the semiconductor layers 41A, 41B, and 41C will be described later.

The conductive layer 43 is closest to the circuit layer PE next to the conductive layer 41 among a plurality of conductive layers. The conductive layer 43 is, for example, a metal or a semiconductor. The metal used in the conductive layer 43 is, for example, tungsten. The semiconductor used in the conductive layer 43 is, for example, silicon doped with phosphorus. In the conductive layer 43, a voltage is applied to the memory pillar MP, and positive holes are generated within the semiconductor layer. The conductive layer 43 functions as the second selection transistor S2.

The plurality of conductive layers excluding the conductive layers 41 and 43 are a plurality of conductive layers 45. The plurality of conductive layers 45 are above the conductive layer 43. Each of the conductive layers 45 is interposed between the insulating layers 44. The conductive layers 45 contain, for example, a conductive metal. The conductive metal is, for example, tungsten. The conductive layers 45 may be, for example, polysilicon doped with impurities. Each of the plurality of conductive layers 45 is connected to one of the plurality of word lines WL through the contact plug CC. Each of the plurality of conductive layers 45 functions as the gate electrodes of the memory cell transistors MT. Conductive layers 45 located lower among the plurality of conductive layers 45 (for example, several conductive layers from the bottom) may function as the second selection transistor S2. The number of conductive layers 45 is arbitrary.

The insulating layer 42 is between the conductive layer 41 and the conductive layer 43. The plurality of insulating layers 44 are between the conductive layers 43 and next to each other in the Z direction. The insulating layers 42 and 44 contain, for example, a silicon oxide. The insulating layers 42 and 44 insulate between the conductive layers 41, 43, and 45 adjacent to each other. The number of insulating layers 44 is determined according to the number of conductive layers 45.

The cover insulating layer 50 is on the insulating layer 44 which is an uppermost layer of the stack 40. The cover insulating layer 50 insulate between the stack 40 and the bit lines BL. The cover insulating layer 50 includes, for example, a first layer 51 and a second layer 52. The cover insulating layer 50 contains, for example, a silicon oxide.

The plurality of bit lines BL are on the cover insulating layer 50. In addition, as shown in FIG. 4, the bit lines BL are electrically connected to any of the memory pillars MP and the contact plugs CP1. In FIG. 5, the bit line BL is connected to the memory pillar MP through the vias V1 and V2. The vias V1 and V2 contain, for example, tungsten. The via V1 is within the first layer 51 of the cover insulating layer 50. The via V2 is within the second layer 52 of the cover insulating layer 50.

The contact plug CP1 extends in the Z direction. The contact plug CP1 electrically connects the bit line BL and the interconnection layer D1 of the circuit layer PE. The contact plug CP1 includes a conductive part 71 and insulating layers 72 and 73. The insulating layer 72 coats the outside surface of the conductive part 71. The insulating layer 73 coats the outside surface of the insulating layer 72 at a height position overlapping the conductive layers 41 and 43 in the Z direction. The conductive part 71 contains, for example, tungsten. The insulating layers 72 and 73 contain, for example, a silicon oxide.

The slits SLT and ST1 extend in the Z direction. The slits SLT and ST1 extend from the uppermost surface of the stack 40 to the conductive layer 41. The inner portions of the slits SLT and ST1 are insulators. The insulators contain, for example, a silicon oxide.

The memory pillar MP is within the stack 40. The memory pillar MP extends in the Z direction. The memory pillar MP extends from the uppermost surface of the stack 40 to the conductive layer 41.

Figure 6:
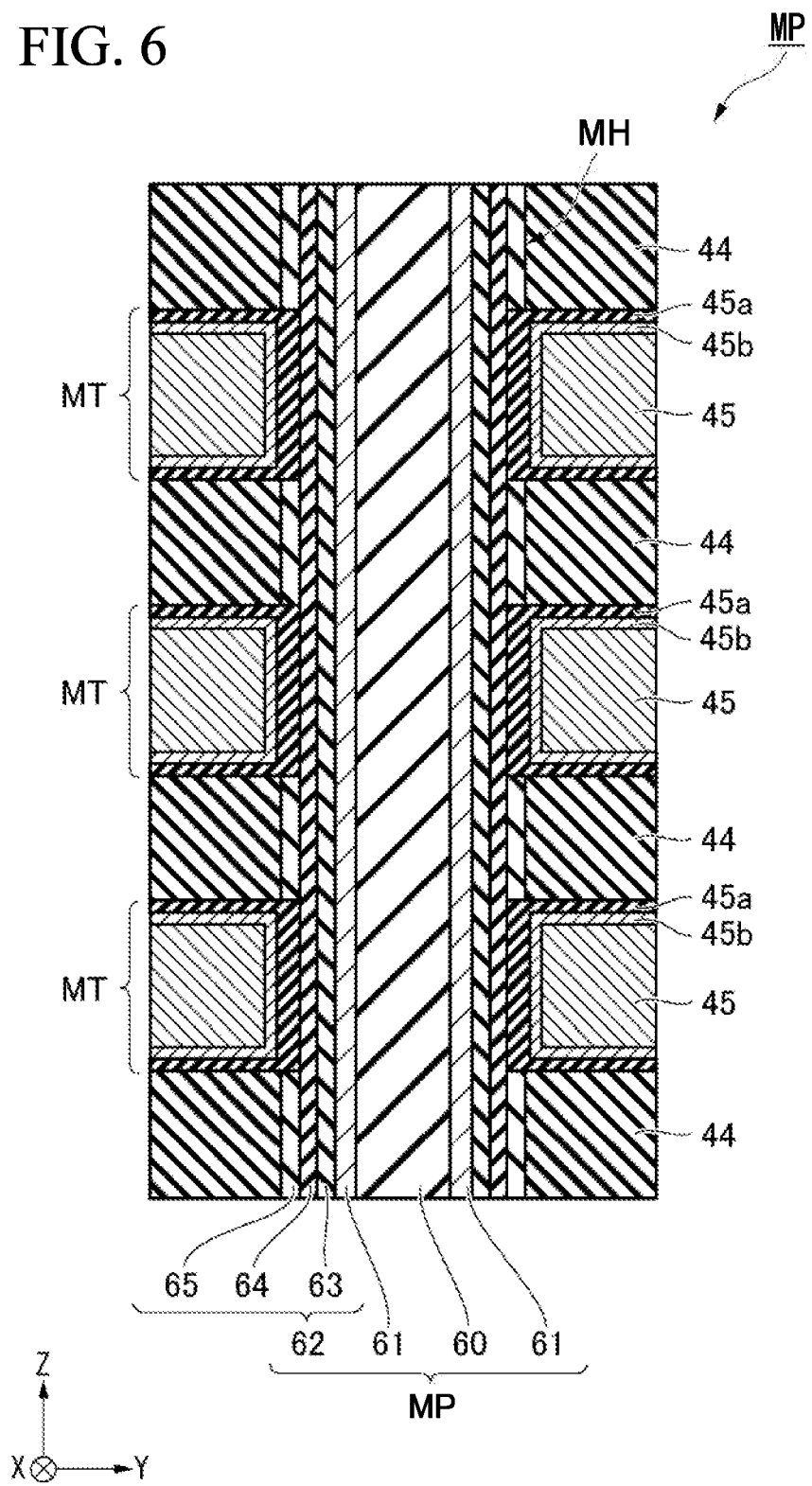
FIG. 6 is an enlarged cross-sectional view illustrating the vicinity of a memory pillar of the semiconductor storage device according to the first embodiment.
Figure 7:
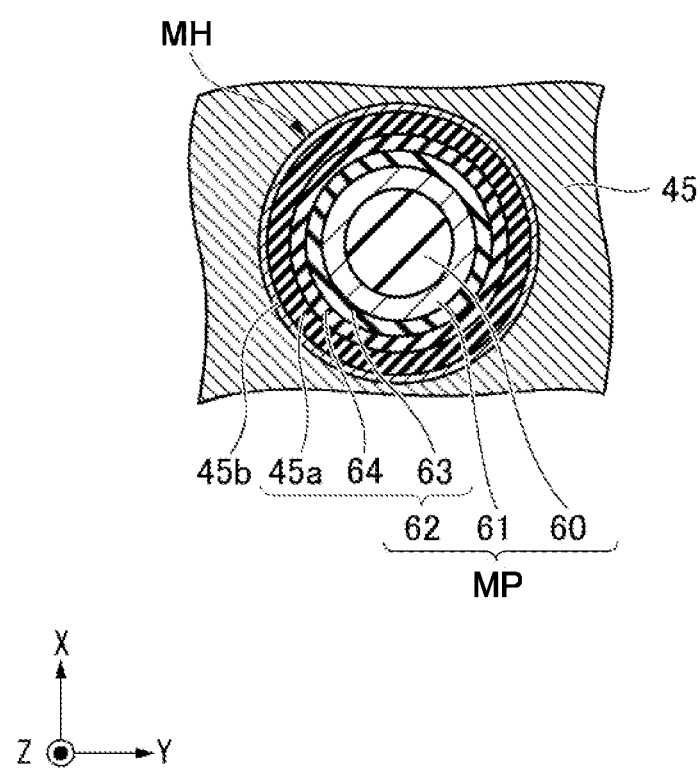
FIG. 7 is an enlarged cross-sectional view obtained by cutting the vicinity of the memory pillar of the semiconductor storage device according to the first embodiment along a conductive layer.

FIG. 6 is an enlarged cross-sectional view illustrating the vicinity of the memory pillar MP of the semiconductor memory 1 according to the first embodiment. FIG. 7 is a cross-sectional view obtained by cutting the vicinity of the memory pillar MP of the semiconductor memory 1 according to the first embodiment along the conductive layer 45. FIG. 6 is a cross section obtained by cutting the memory pillar MP along a YZ plane, and FIG. 7 is a cross section obtained by cutting the memory pillar MP along an XY plane. The memory pillar MP is within a memory hole MH formed in the stack 40.

The memory pillar MP includes a core 60, a semiconductor layer 61, and a memory film 62. The core 60, the semiconductor layer 61, and the memory film 62 are within the memory hole MH in order from the inner side. The memory pillar MP is, for example, circular or elliptical when seen from the Z direction.

The core 60 extends in the Z direction, and is columnar. The core 60 contains, for example, a silicon oxide. The core 60 is inside the semiconductor layer 61.

The semiconductor layer 61 extends in the Z direction. The semiconductor layer 61 is a bottomed cylinder. The semiconductor layer 61 coats the outside surface of the core 60. The semiconductor layer 61 contains, for example, silicon. The silicon is, for example, polysilicon obtained by crystallizing amorphous silicon. The semiconductor layer 61 is a channel of each of the first selection transistor S1, the memory cell transistor MT, and the second selection transistor S2. The channel is a flow channel of carriers between the source side and the drain side.

The memory film 62 extends in the Z direction. The memory film 62 coats the outside surface of the semiconductor layer 61. The memory film 62 is between the inner surface of the memory hole MH and the outside surface of the semiconductor layer 61. The memory film 62 includes, for example, a tunnel insulating film 63, a charge storage film 64, and a cover insulating film 65. The tunnel insulating film 63, the charge storage film 64, and then the cover insulating film 65 are in this order near the semiconductor layer. A portion of the memory film 62 is missing at a position connected to the semiconductor layer 41B. The memory film 62 is not disposed between the semiconductor layer 41B and the semiconductor layer 61. The semiconductor layer 41B and the semiconductor layer 61 are in contact with each other without going through the memory film 62.

The tunnel insulating film 63 is between the charge storage film 64 and the semiconductor layer 61. The tunnel insulating film 63 contains, for example, a silicon oxide, or a silicon oxide and a silicon nitride. The tunnel insulating film 63 is a potential barrier between the semiconductor layer 61 and the charge storage film 64.

The charge storage film 64 is between each of the conductive layer 45 and the insulating layer 44 and the tunnel insulating film 63. The charge storage film 64 contains, for example, a silicon nitride. A portion at which the charge storage film 64 and each of the plurality of conductive layers 45 intersect each other functions as a transistor. The memory cell transistor MT holds data depending on the presence or absence of charges within portions (charge storage parts) at which the charge storage film 64 intersects the plurality of conductive layers 45 or the amount of charges stored. The charge storage part is between each of the conductive layers 45 and the semiconductor layer 61, and surrounds the periphery with an insulating material. The charge storage part is a so-called floating gate structure.

The cover insulating film 65 is between, for example, each of the insulating layers 44 and the charge storage film 64. The cover insulating film 65 contains, for example, a silicon oxide. The cover insulating film 65 protects the charge storage film 64 from etching during processing. The cover insulating film 65 may not be present, or may be used as a block insulating film with a portion thereof left between the conductive layer 45 and the charge storage film 64.

In addition, as shown in FIGS. 6 and 7, a block insulating film 45a and a barrier film 45b may be included between the conductive layer 45 and the insulating layer 44 and between the conductive layer 45 and the memory film 62. The block insulating film 45a suppresses back-tunneling. Back-tunneling is a phenomenon in which charges return from the conductive layer 45 to the memory film 62. The barrier film 45b improves adhesion between the conductive layer 45 and the block insulating film 45a. The block insulating film 45a is, for example, a silicon oxide film or a metal oxide film. An example of a metal oxide is an aluminum oxide. For example, in a case where the conductive layer 45 is tungsten, the barrier film 45b is a laminated structure film of a titanium nitride and titanium as an example.

Figure 8:
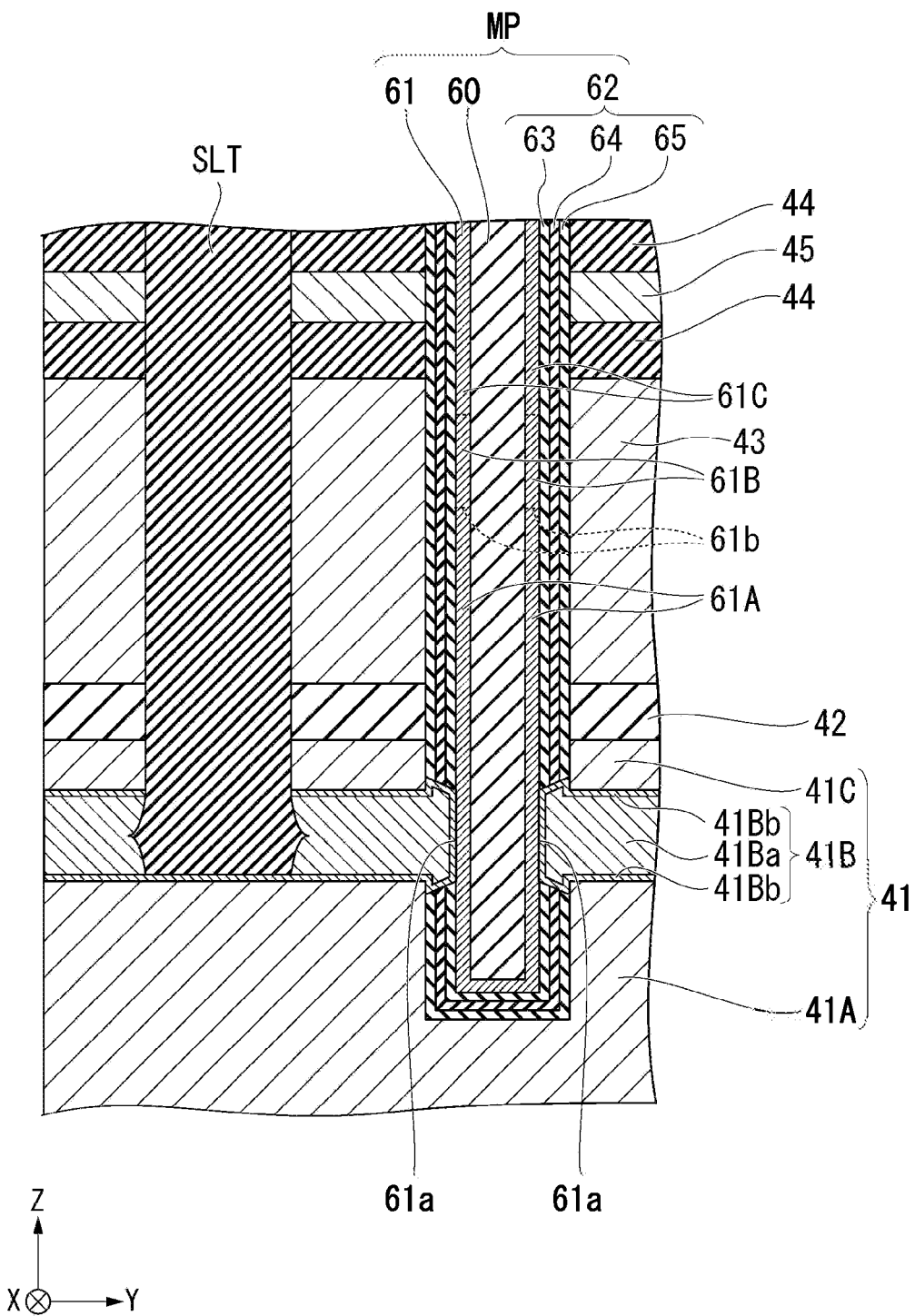
FIG. 8 is an enlarged cross-sectional view illustrating a feature portion of the semiconductor storage device according to the first embodiment.

FIG. 8 is an enlarged cross-sectional view illustrating a feature portion of the semiconductor memory 1 according to the first embodiment. The semiconductor layer 61 includes, for example, a first region 61A, a second region 61B, and a third region 61C. The first region 61A, the second region 61B, and then the third region 61C are in the order the semiconductor layer 41B in the Z direction.

The first region 61A is a lower portion of the semiconductor layer 61. The first region 61A extends from, for example, a boundary 61a between the semiconductor layer 61 and the semiconductor layer 41B in the Z direction. The first region 61A is surrounded by, for example, the conductive layer 41, the insulating layer 42, and a portion of the conductive layer 43 in the XY direction. The height position of a boundary 61b between the first region 61A and the second region 61B is, for example, in a range of the height of the conductive layer 43 in the Z direction. The range of the height of the conductive layer 43 is a range of height interposed between the upper surface and the lower surface of the conductive layer 43.

The first region 61A contains both an n-type impurity and a p-type impurity. In the first region 61A, the concentration of the n-type impurity is higher than the concentration of the p-type impurity. The concentration of the n-type impurity at the boundary 61a between the semiconductor layer 61 and the semiconductor layer 41B is higher than the concentration of the n-type impurity at the boundary 61b between the first region 61A and the second region 61B. The concentration of the p-type impurity at the boundary 61a between the semiconductor layer 61 and the semiconductor layer 41B is higher than the concentration of the p-type impurity at the boundary 61b between the first region 61A and the second region 61B.

The first region 61A is an n-type semiconductor. The first region 61A is formed of, for example, an $n^+$-type semiconductor and an $n^-$-type semiconductor. For example, in the first region 61A, a portion close to the semiconductor layer 41B is an n⁻-type semiconductor, and a portion distant therefrom is an n⁻-type semiconductor. The n-type impurity is, for example, phosphorus. The p-type impurity is, for example, boron. The concentration of the n-type impurity in the first region 61A is, for example, equal to or greater than $1\times10^{19}$ cm$^{-3}$.

The second region 61B is between the first region 61A and the third region 61C. The second region 61B is farther from the boundary 61a between the semiconductor layer 41B and the semiconductor layer 61 than the first region 61A in the Z direction. At least a portion of the second region 61B falls within a range of the height of the conductive layer 43 in the Z direction. The second region 61B falls within, for example, a range of the height of the conductive layer 43 in the Z direction. The second region 61B overlaps the conductive layer 43, for example, when seen from the X direction or the Y direction. The second region 61B is surrounded by the conductive layer 43, for example, in the XY direction.

The second region 61B contains a p-type impurity. The second region 61B contains, for example, an n-type impurity and a p-type impurity. The second region 61B can be divided into, for example, a region close to the first region 61A and a region distant from the first region 61A. The region close to the first region 61A contains both an n-type impurity and a p-type impurity, and the region distant from the first region 61A contains only a p-type impurity. The second region 61B is a p-type semiconductor. The concentration of the p-type impurity in the second region 61B is, for example, equal to or greater than $1\times10^{18}$ cm$^{-3}$ and equal to or less than $1\times10^{19}$ cm$^{-3}$.

The third region 61C is on the opposite side to the first region 61A with reference to the second region 61B. The third region 61C is farther from the boundary 61a between the semiconductor layer 41B and the semiconductor layer 61 than the second region 61B in the Z direction. At least a portion of the third region 61C is surrounded by, for example, any of the conductive layers 45 in the XY direction.

The third region 61C has a lower concentration of a p-type impurity and an n-type impurity than the second region 61B. The third region 61C has, for example, an impurity concentration equal to or less than $1\times10^{18}$ cm$^{-3}$. The third region 61C is, for example, an intrinsic semiconductor containing few n-type impurities and few p-type impurities.

In the semiconductor layer 61, the concentration of the n-type impurity decreases with distance from the boundary 61a between the semiconductor layer 41B and the semiconductor layer 61 in the Z direction. In the semiconductor layer 61, the concentration of the p-type impurity decreases with distance from the boundary 61a between the semiconductor layer 41B and the semiconductor layer 61 in the Z direction.

The concentration of the n-type impurity and the concentration of the p-type impurity in the semiconductor layer 61 can be measured using, for example, secondary ion mass spectrometry (SIMS).

The conductive layer 41 includes, for example, the semiconductor layer 41A, the semiconductor layer 41B, and the semiconductor layer 41C as described above. The semiconductor layer 41A is on the circuit layer PE. The semiconductor layer 41A is, for example, an n-type semiconductor. The semiconductor layer 41A is, for example, polysilicon doped with impurities. The semiconductor layer 41B is on the semiconductor layer 41A. The semiconductor layer 41A is in contact with the semiconductor layer 61 of the memory pillar MP. The semiconductor layer 41B is, for example, an epitaxial film doped with impurities. The semiconductor layer 41C is on the semiconductor layer 41B. The semiconductor layer 41C is, for example, an n-type or non-doped semiconductor.

The semiconductor layer 41B includes, for example, a first layer 41Ba and a second layer 41Bb. The first layer 41Ba extends into the XY plane. The first layer 41Ba contains an n-type impurity. The first layer 41Ba contains, for example, phosphorus. The first layer 41Ba is an n-type semiconductor. The first layer 41Ba is an example of a first portion.

The second layer 41Bb coats at least a portion of the first layer 41Ba. The second layer 41Bb contains a p-type impurity. The second layer 41Bb contains, for example, boron. The second layer 41Bb is, for example, a p-type semiconductor, and an n-type semiconductor containing a p-type impurity. The second layer 41Bb is an example of a second portion. A portion of the second layer 41Bb is between the first layer 41Ba and the semiconductor layer 61. The thickness of the second layer 41Bb is, for example, equal to or greater than 1 nm and equal to or less than 10 nm.

Next, a method of manufacturing a portion of the cell array region CA of the semiconductor memory 1 according to the first embodiment will be described. The following FIGS. 9 to 16 are cross-sectional views illustrating an example of a method of manufacturing the cell array region CA. The following FIGS. 9 to 16 show only portions located above the conductive layer 41.

First, the element isolation region 30A is formed within the substrate 30, and the transistor Tr is formed within the circuit layer PE (see FIG. 1). The transistor Tr can be manufactured using a well-known method. In addition, in the circuit layer PE, a plurality of interconnection layers D0 and D1 and a plurality of vias C1 and C2 which are electrically connected to the transistor Tr are formed within the insulating layer E1. The plurality of interconnection layers D0 and D1 and the plurality of vias C1 and C2 can be manufactured using a well-known method.

Figure 9:
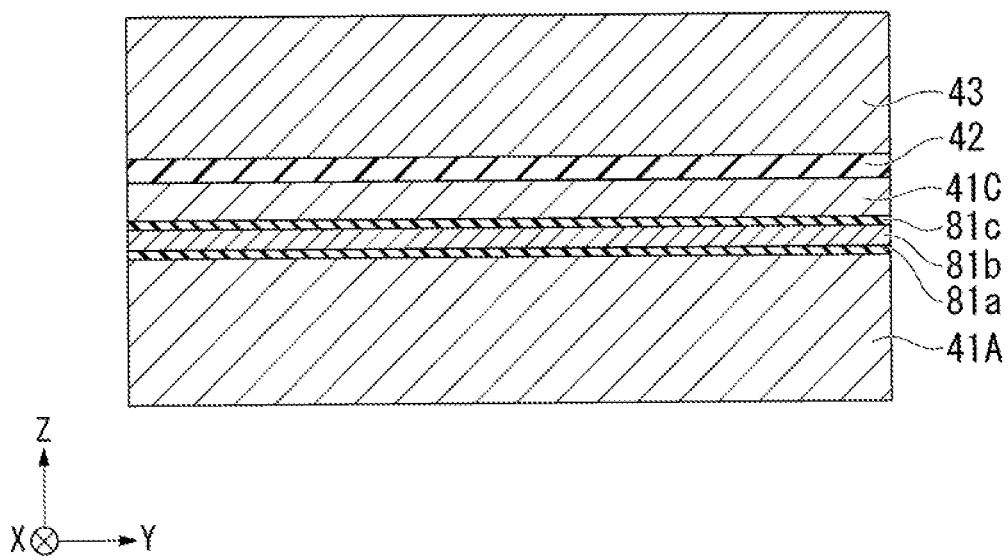
FIG. 9 is a cross-sectional view illustrating an example of a method of manufacturing the semiconductor storage device according to the first embodiment.

Next, as shown in FIG. 9, the semiconductor layer 41A, an intermediate film 81a, a sacrificial film 81b, an intermediate film 81c, the semiconductor layer 41C, the insulating layer 42, and the conductive layer 43 are laminated on the circuit layer PE in this order. The intermediate film 81a and the intermediate film 81c contain, for example, a silicon oxide. The sacrificial film 81b is, for example, p-type doped silicon, n-type doped silicon, or non-doped silicon. The semiconductor layer 41A, the semiconductor layer 41C, the insulating layer 42, and the conductive layer 43 are the same as described.

Figure 10:
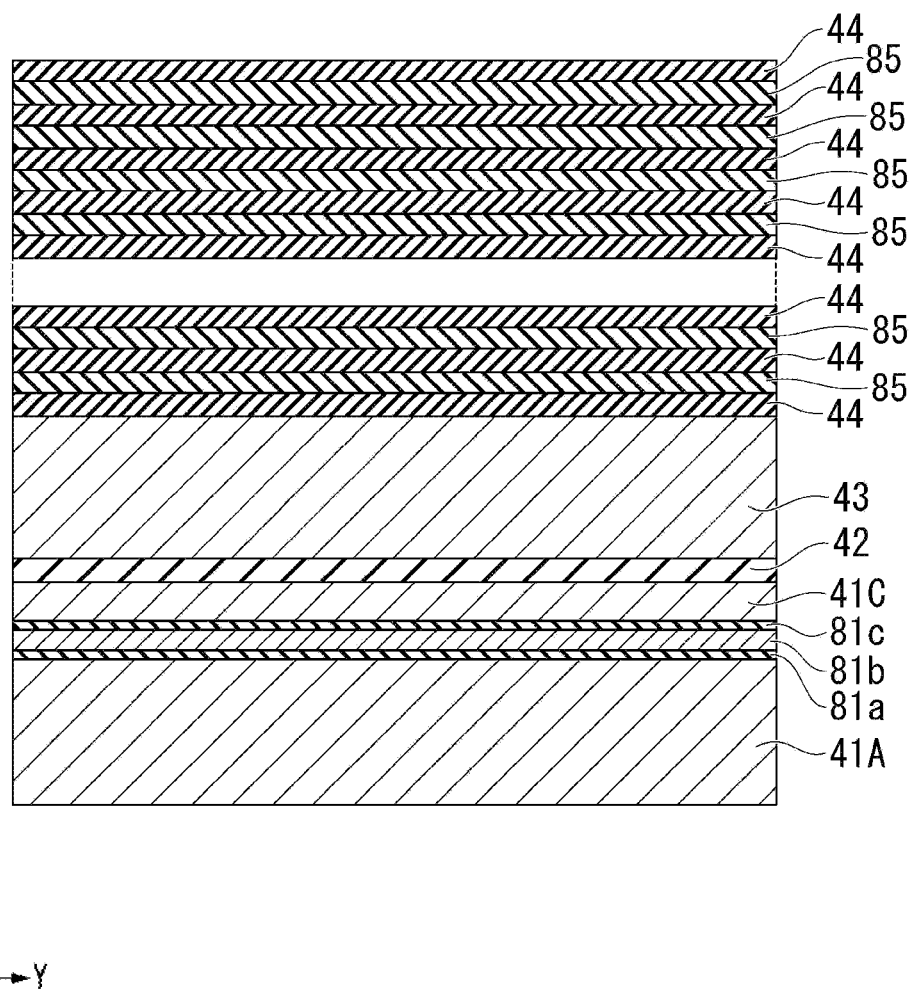
FIG. 10 is a cross-sectional view illustrating an example of a method of manufacturing the semiconductor storage device according to the first embodiment.

Next, as shown in FIG. 10, the insulating layer 44 and a sacrificial film 85 are alternately laminated on the conductive layer 43. As described above, the insulating layer 44 contains, for example, a silicon oxide. The sacrificial film 85 contains, for example, a silicon nitride.

Figure 11:
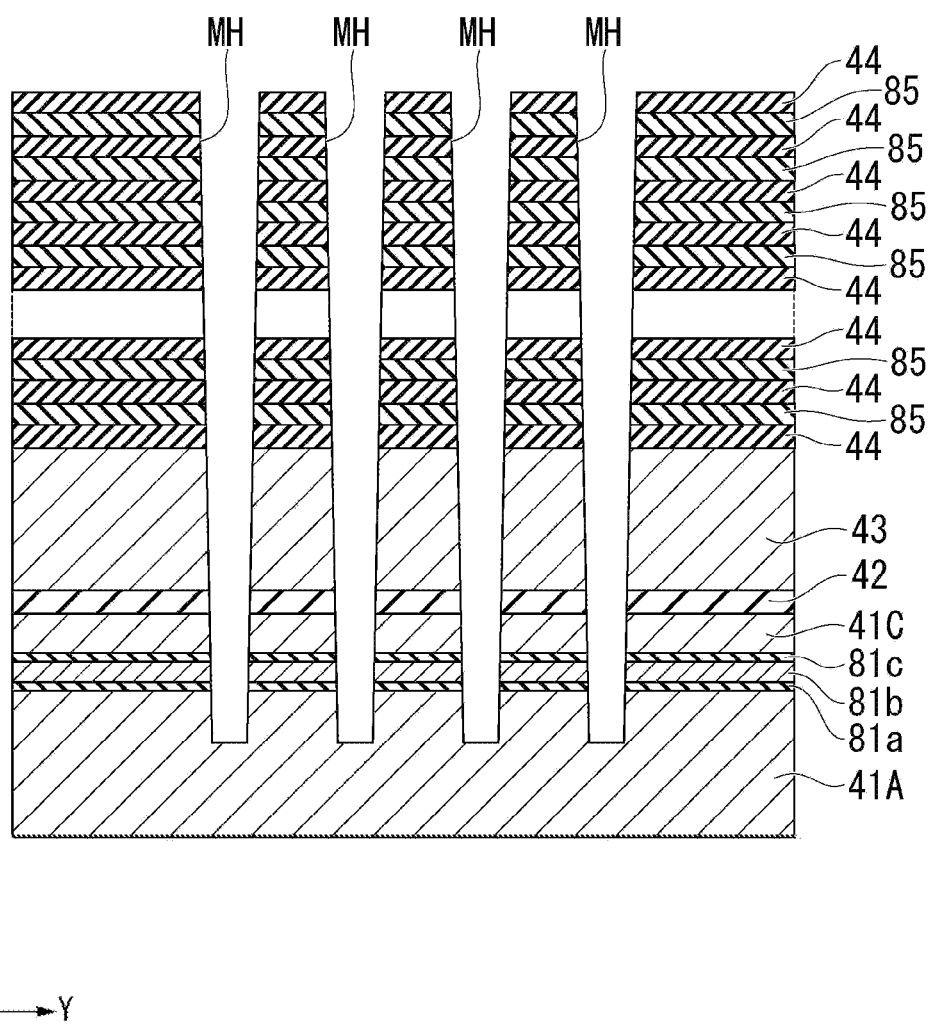
FIG. 11 is a cross-sectional view illustrating an example of a method of manufacturing the semiconductor storage device according to the first embodiment.

Next, as shown in FIG. 11, the memory hole MH is formed in a stack. The memory hole MH extends from the upper surface of the stack halfway to the semiconductor layer 41A. The memory hole MH is manufactured by etching. For example, anisotropic etching is performed from the upper surface of the stack to the semiconductor layer 41A. The anisotropic etching is, for example, reactive ion etching (RIE).

Figure 12:
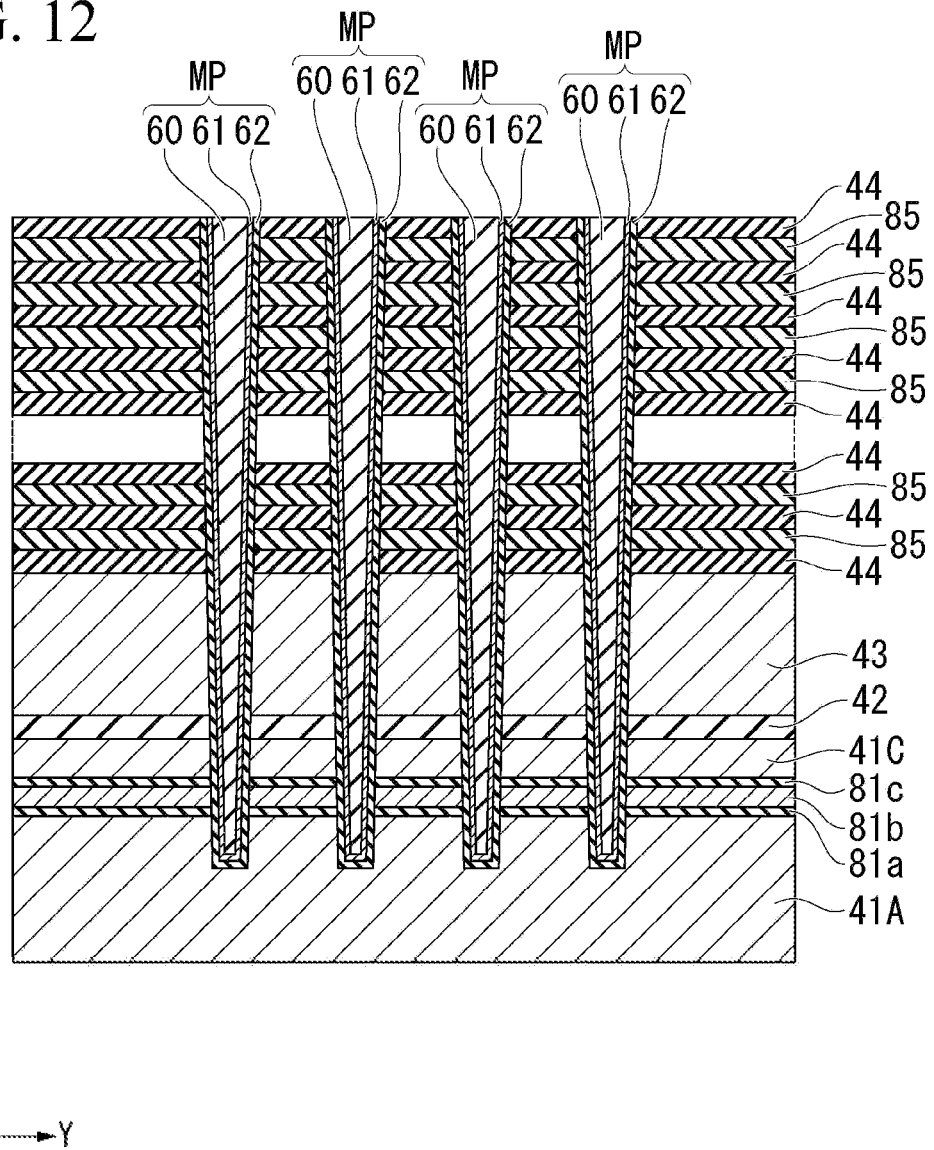
FIG. 12 is a cross-sectional view illustrating an example of a method of manufacturing the semiconductor storage device according to the first embodiment.

Next, as shown in FIG. 12, the memory film 62, the semiconductor layer 61, and the core 60 are formed within the memory hole MH in this order. The memory hole MH is buried in the memory film 62, the semiconductor layer 61, and the core 60. The memory pillar MP is formed within the memory hole MH.

Figure 13:
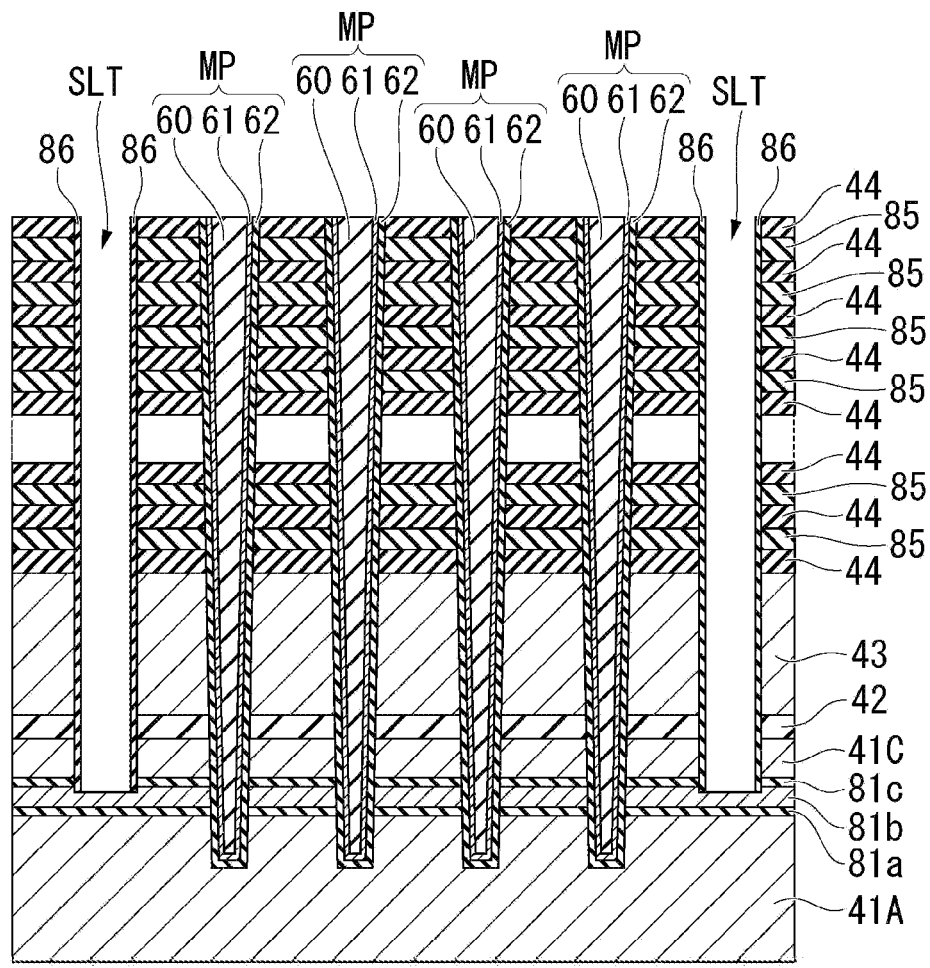
FIG. 13 is a cross-sectional view illustrating an example of a method of manufacturing the semiconductor storage device according to the first embodiment.

Next, as shown in FIG. 13, the slit SLT is formed in the stack. The slit SLT extends from the upper surface of the stack halfway to the sacrificial film 81b. The slit SLT is formed by anisotropic etching. A stopper film 86 is formed on the inner wall of the slit SLT. The stopper film 86 is, for example, a silicon nitride film.

Figure 14:
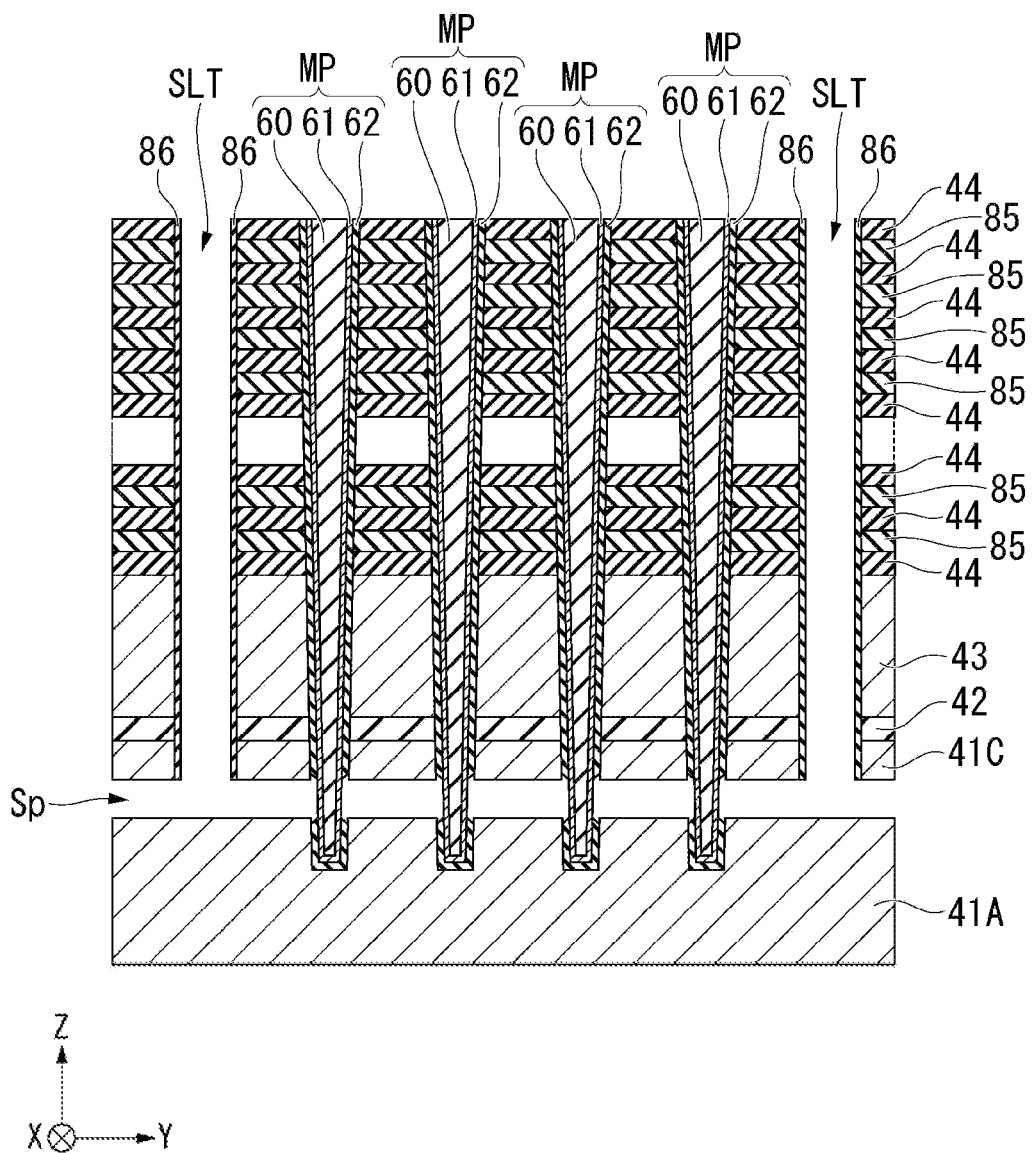
FIG. 14 is a cross-sectional view illustrating an example of a method of manufacturing the semiconductor storage device according to the first embodiment.

Next, as shown in FIG. 14, the sacrificial film 81b is isotropically etched through the slit SLT. The sacrificial film 81b is removed by isotropic etching. The isotropic etching is performed using an etchant capable of etching n-type doped silicon or non-doped silicon earlier as compared with a silicon oxide and a silicon nitride. In addition, a portion of the memory film 62 is also removed by etching. In the memory film 62, the sacrificial film 81b is removed, and an exposed portion is removed. The memory film 62 is etched using an etchant capable of etching a silicon oxide earlier as compared with a silicon nitride. The intermediate films 81a and 81c are removed simultaneously with the memory film 62. A space Sp is formed between the semiconductor layer 41A and the semiconductor layer 41C.

Figure 15:
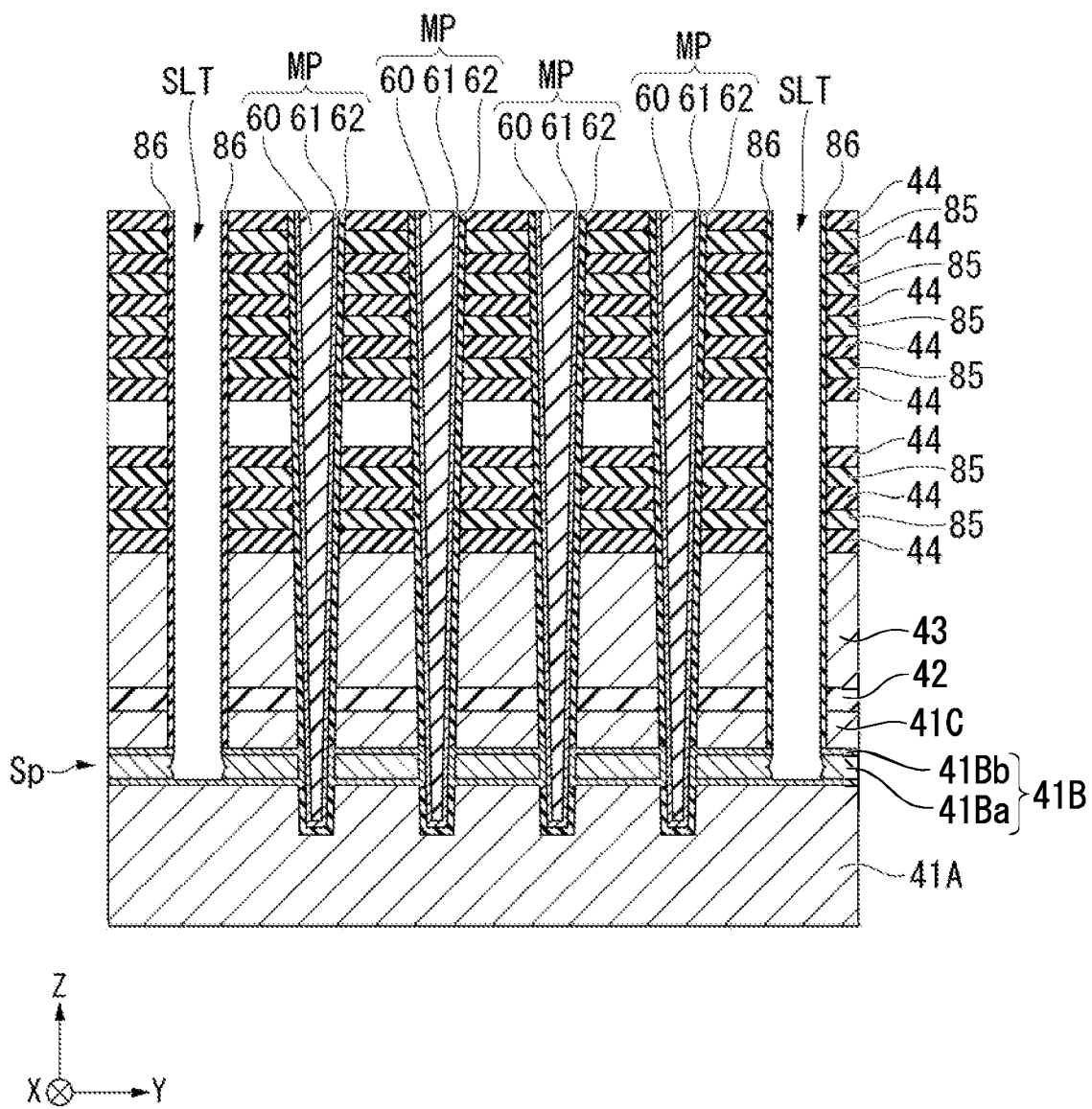
FIG. 15 is a cross-sectional view illustrating an example of a method of manufacturing the semiconductor storage device according to the first embodiment.

Next, as shown in FIG. 15, the inner portion of the space Sp is buried with semiconductors through the slit SLT. First, the second layer 41Bb is formed within the space Sp. The second layer 41Bb is formed at a boundary between the space Sp and the semiconductor layer 41A or the semiconductor layer 41C. Next, the first layer 41Ba is formed inside the second layer 41Bb. Materials of the first layer 41Ba and the second layer 41Bb are as described. The first layer 41Ba contains an n-type impurity, and the second layer 41Bb contains a p-type impurity.

Figure 16:
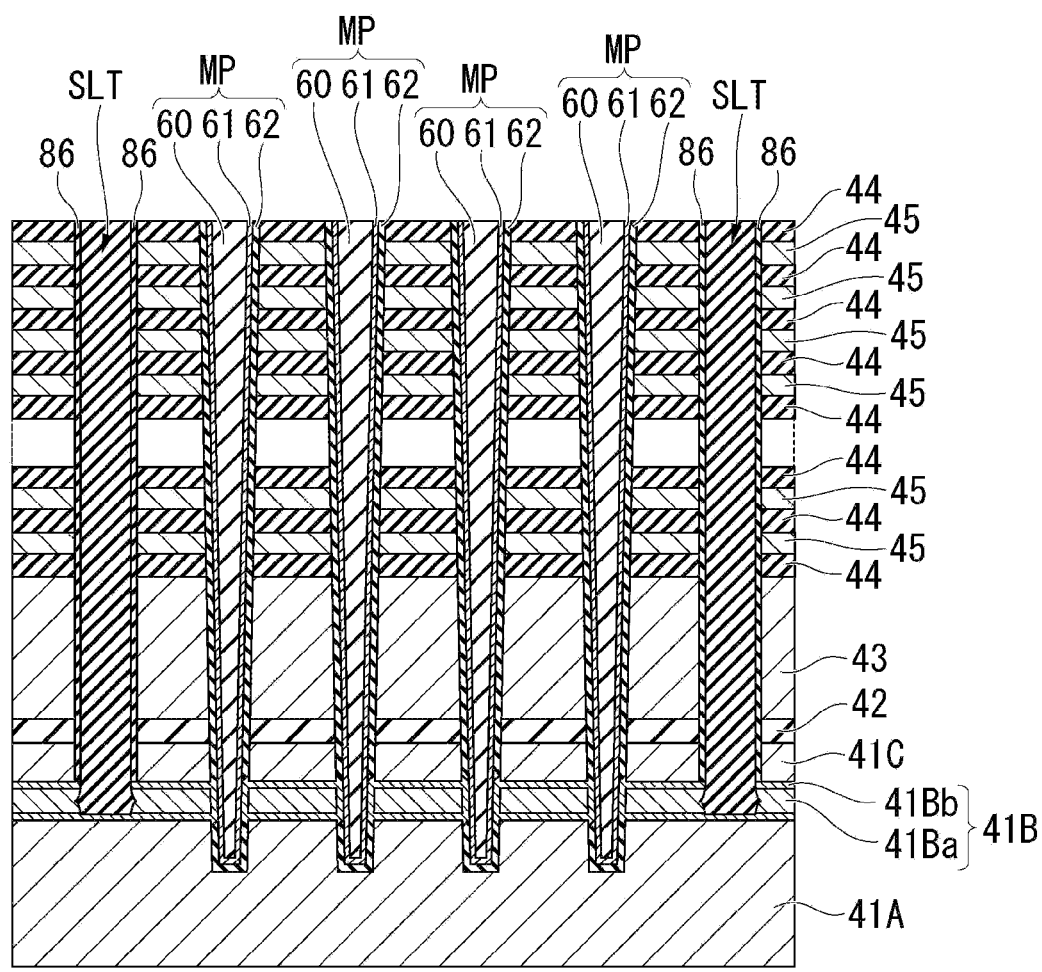
FIG. 16 is a cross-sectional view illustrating an example of a method of manufacturing the semiconductor storage device according to the first embodiment.

Next, as shown in FIG. 16, the sacrificial film 85 is replaced with the conductive layer 45. First, the stopper film 86 and the sacrificial film 85 are removed through the slit SLT. The stopper film 86 and the sacrificial film 85 are removed by isotropic etching. In the isotropic etching, an etchant capable of etching a silicon nitride earlier as compared with a silicon oxide and polysilicon is used. Thereafter, a portion in which the sacrificial film 85 is removed is buried with a conductive material, and the conductive layer 45 is formed. Finally, the inner portion of the slit SLT is buried with an insulator.

The cell array region CA is manufactured by the above processes. The manufactured cell array region CA is heated in a post-process. The n-type impurity of the first layer 41Ba and the p-type impurity of the second layer 41Bb are diffused to the semiconductor layer 61 by heating. Since the second layer 41Bb is closer to the semiconductor layer 61 than the first layer 41Ba, and the diffusion rate of the p-type impurity is faster than the diffusion rate of the n-type impurity, the p-type impurity is diffused to a position farther from the semiconductor layer 41B than the n-type impurity. The first region 61A and the second region 61B of the semiconductor layer 61 are formed by, for example, thermal diffusion of an n-type or p-type impurity through heating. The manufacturing processes shown herein are an example, and other processes may be inserted between the processes.

According to the semiconductor memory 1 of the first embodiment, it is possible to achieve an improvement in the speed of an erasure operation of data. The memory cell array 10 stores data using charge stored in the charge storage film 64. When holes are injected into the charge storage film 64, data is erased. The holes are supplied from the semiconductor layer 61 to the charge storage film 64.

During the erasure operation, the semiconductor layer 61 generates holes due to a phenomenon called gate-induced drain leakage (GIDL). In a case where the first region 61A is an n-type semiconductor, when a negative voltage is applied to the conductive layer 43 against the conductive layer 41, an electric field occurs in the semiconductor layer 61 extending from the first region 61A to the third region 61C and pairs of electrons and holes are generated. The semiconductor layer 61 is charged by these holes being stored in the semiconductor layer 61. When the semiconductor layer 61 is sufficiently charged with holes, an electric field occurs between the semiconductor layer 61 and the charge storage film 64, and holes are injected into the charge storage film 64. When holes are injected into the charge storage film 64, data is erased. When the amount of holes generated due to GIDL is small, it takes time to charge the semiconductor layer 61, and thus it takes time to erase data. The memory cell array 10 according to the first embodiment has a tendency to generate holes within the semiconductor layer 61. Hereinafter, the reason will be described.

Figure 17:
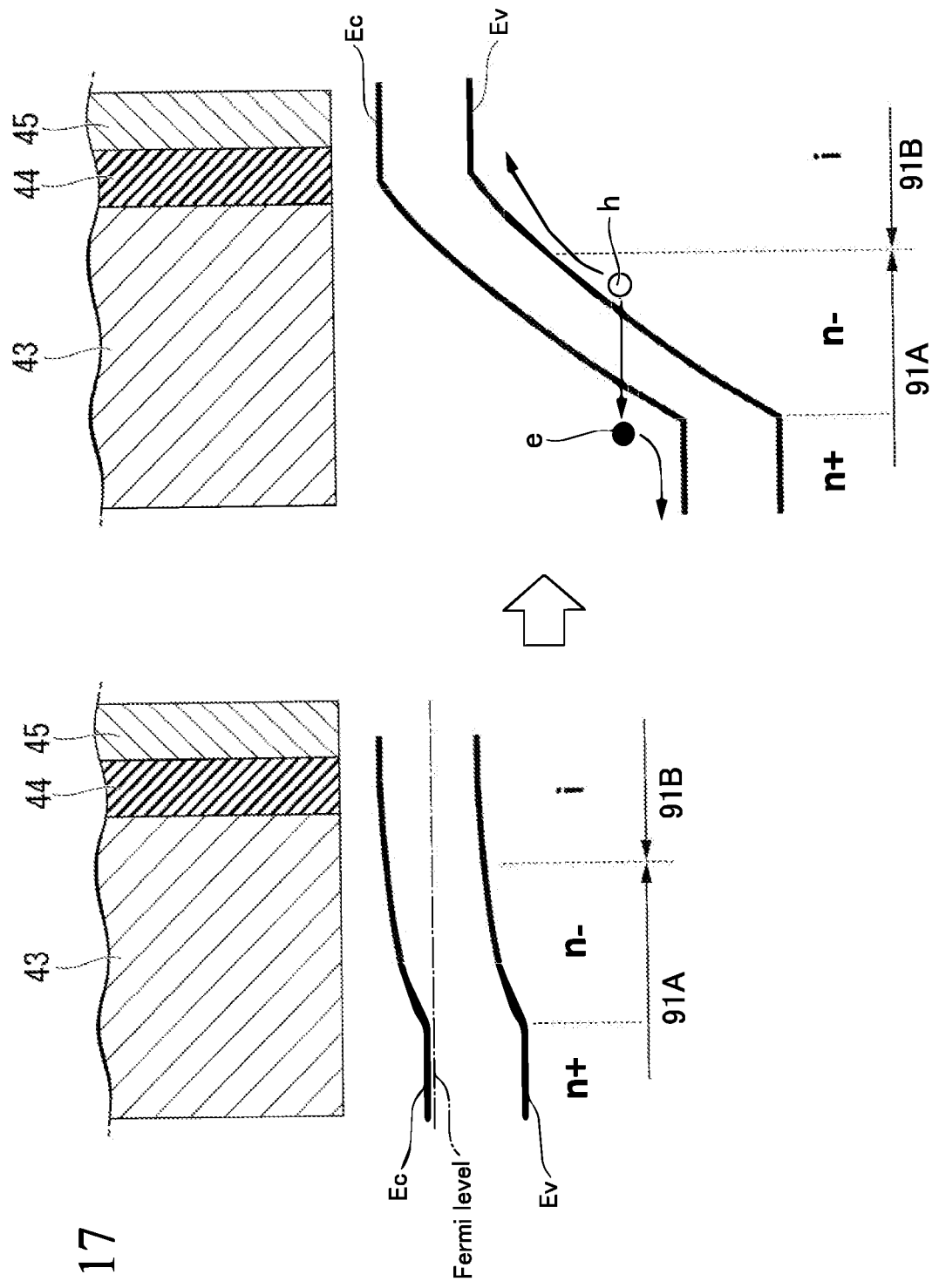
FIG. 17 is a diagram schematically illustrating a band structure of a semiconductor layer in a memory cell array according to a comparative example.

FIG. 17 is a diagram schematically illustrating a band structure of a semiconductor layer in the vicinity of a conductive layer 43 of a memory cell array according to a comparative example. In the comparative example, there is no region in which the concentration of a p-type impurity in the semiconductor layer is higher than the concentration of an n-type impurity.

The semiconductor layer shown in FIG. 17 includes a first region 91A and a second region 91B. In FIG. 17, the first region 91A is an n-type semiconductor, and the second region 91B is an intrinsic semiconductor. Similarly to the above-described memory cell array 10, the n-type impurity is diffused from a contact between the semiconductor layer 41B and the memory pillar MP. The first region 91A is closer to the contact between the semiconductor layer 41B and the memory pillar MP than the second region 91B. In the first region 91A, a side close to the contact between the semiconductor layer 41B and the memory pillar MP is an n$^+$ semiconductor, and a side distant therefrom is an n$^-$ semiconductor.

The left of FIG. 17 is a band structure in a thermal equilibrium state, and the right is a band structure when a positive voltage is applied to the conductive layer 41 and a negative voltage is applied to the conductive layer 43 against the conductive layer 41 with reference to the potential of the second region 91B. FIG. 17 shows a band structure in the vicinity of a valence band upper end Ev and a conduction band lower end Ec. When an electric field is applied to the semiconductor layer, the band structure of the semiconductor layer changes. The band structure changes, for example, from the left state of FIG. 17, that is, a thermal equilibrium state to the right state, that is, an erasing bias application state. Since the energy level of the first region 91A in an n$^+$ semiconductor region and the energy level of the second region 91B in the vicinity of the conductive layer 43 are different from each other, a band is inclined due to a difference in the energy level between these regions and a depletion layer is formed. When electrons e in a valence band transition to a conduction band due to interband tunneling in the depletion layer, holes h are generated in the valence band. The holes h flow to the second region 91B side along an electric field in the depletion layer, and charge the semiconductor layer.

Figure 18:
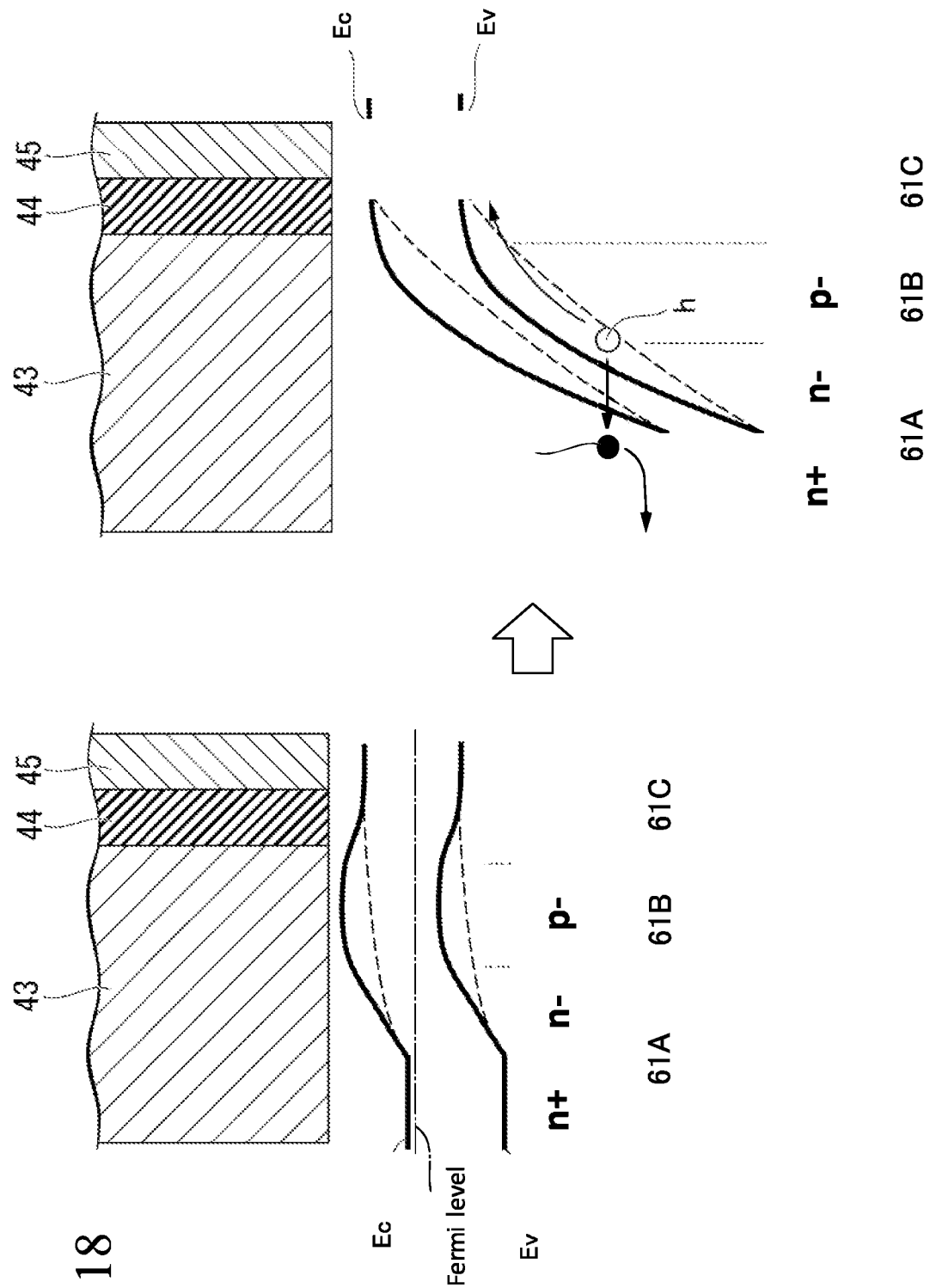
FIG. 18 is a diagram schematically illustrating a band structure of a semiconductor layer in the memory cell array according to the first embodiment.

FIG. 18 is a diagram schematically illustrating a band structure of the semiconductor layer 61 in the vicinity of the conductive layer 43 of the memory cell array 10 according to the present embodiment.

As shown in FIG. 18, the semiconductor layer according to the present embodiment includes the first region 61A, the second region 61B, and the third region 61C. As described above, the first region 61A is a region in which the concentration of the n-type impurity is higher than the concentration of the p-type impurity. In FIG. 18, in the first region 61A, a side close to the contact between the semiconductor layer 41B and the memory pillar MP is an n$^+$ semiconductor, and a side distant therefrom is an n$^-$ semiconductor. The second region 61B is a region in which the concentration of the p-type impurity is higher than the concentration of the n-type impurity. In FIG. 18, the second region 61B is a p$^-$ semiconductor. The third region 61C is a region having a lower concentration of a p-type impurity and an n-type impurity than the second region 61B. In FIG. 18, the third region is an intrinsic semiconductor.

The left of FIG. 18 is a band structure in a thermal equilibrium state. In FIG. 18, for the purpose of comparison, the valence band upper end Ev and the conduction band lower end Ec in the comparative example are shown by dotted lines. Since the second region 61B has a p-type impurity, an energy level in the second region 61B is higher than energy levels in the first region 61A and the third region 61C. In addition, the energy level shown in FIG. 18 is different from the energy level in the comparative example shown in FIG. 17. In the second region 61B, the energy level shown in FIG. 18 is higher than the energy level in the comparative example shown in FIG. 17. In the second region 61B, the energy level of a valence band upper end Ev shown in the left of FIG. 18 is located closer to a Fermi level than the energy level of the valence band upper end Ev in the comparative example shown in the left of FIG. 17. In the second region 61B, the energy level of the conduction band lower end Ec shown in the left of FIG. 18 is located at a position farther from the Fermi level than the energy level of the conduction band lower end Ec in the comparative example shown in the left of FIG. 17.

The right of FIG. 18 is a band structure when a positive voltage is applied to the conductive layer 41 and a negative voltage is applied to the conductive layer 43 against the conductive layer 41 with reference to the potential of the third region 61C, that is, a band structure in an erasing bias application state.

Even in the erasing bias application state, the energy level shown in FIG. 18 is higher than the energy level in the comparative example shown in FIG. 17. As a result, an electric field in the depletion layer is higher than in the comparative example shown in FIG. 17. The holes h generated in the depletion layer flow to the third region 61C side along the electric field. When the electric field in the depletion layer is high, the probability of occurrence of interband tunneling of electrons e$^-$ increases, and the holes h can be efficiently supplied to the third region 61C. That is, in the memory cell array 10 according to the present embodiment, the holes h can be efficiently generated in the semiconductor layer 61, and the erasure operation of data becomes faster.

First Modification Example

Next, a first modification example of the embodiment will be described.

Figure 19:
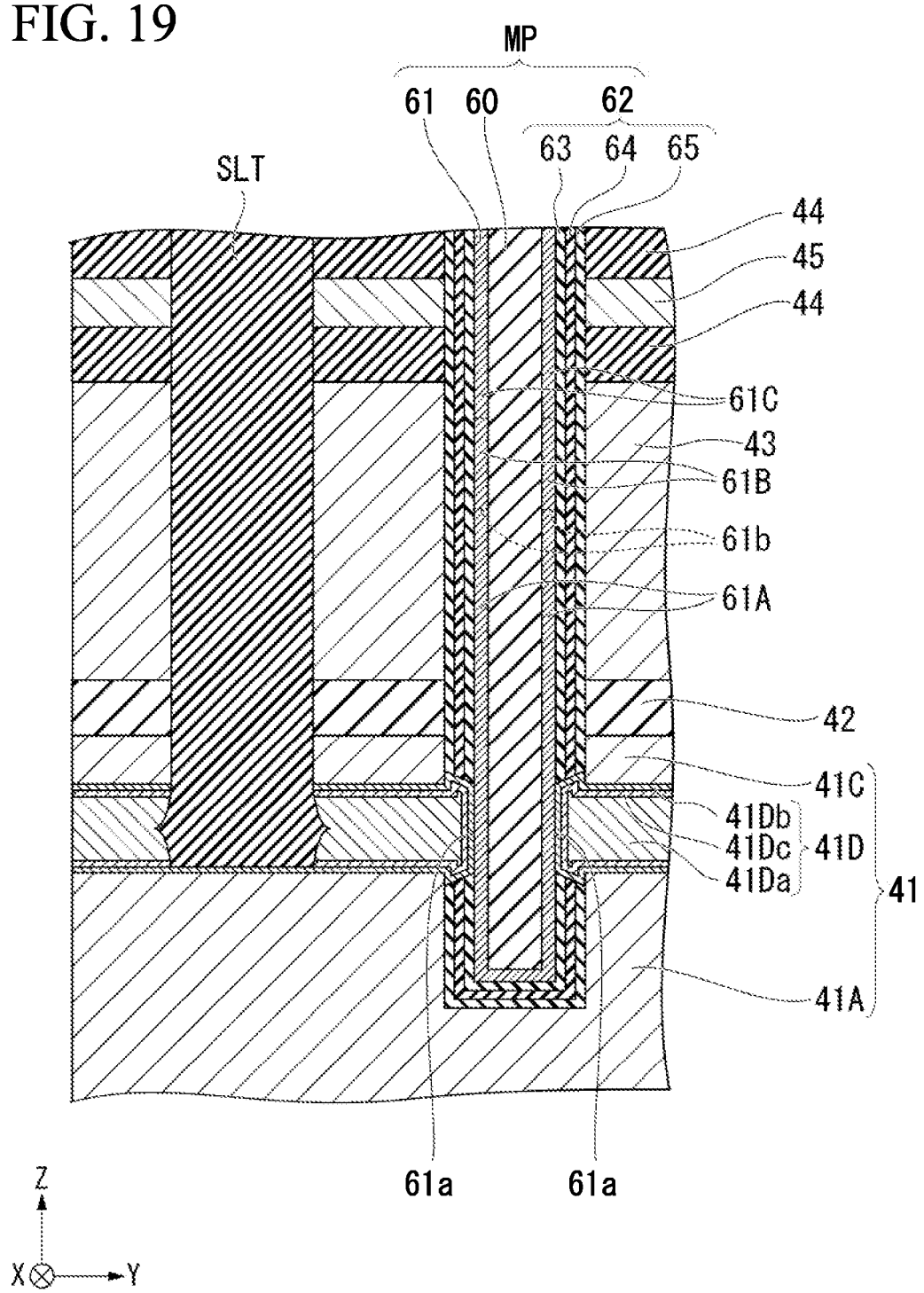
FIG. 19 is an enlarged cross-sectional view illustrating a feature portion of a semiconductor storage device according to a first modification example.

FIG. 19 is an enlarged cross-sectional view illustrating a feature portion of a memory cell array according to the first modification example of the first embodiment. In the memory cell array according to the first modification example, the structure of a conductive layer 41 is different from the structure shown in FIG. 8. Components other than those described below are the same as the memory cell array 10 of the first embodiment.

The conductive layer 41 according to the first modification example includes semiconductor layers 41A, 41D, and 41C. The semiconductor layer 41D includes a first layer 41Da, a second layer 41Db, and a third layer 41Dc. The first layer 41Da is the same as the first layer 41Ba in FIG. 8. The second layer 41Db is the same as the second layer 41Db in FIG. 8.

At least a portion of the third layer 41Dc is between the first layer 41Da and the second layer 41Db. The third layer 41Dc contains a carbon element. The third layer 41Dc is, for example, polysilicon doped with carbon. The third layer 41Dc is an example of a third portion. The thickness of the third layer 41Dc is, for example, equal to or greater than 1 nm and equal to or less than 10 nm.

A method of manufacturing a memory cell array according to the first modification example is the same as the above manufacturing method up to processes leading to FIG. 14. When the space Sp is buried with semiconductors, the second layer 41Db, the third layer 41Dc, and the first layer 41Da are formed in this order. First, the second layer 41Db is formed within the space Sp. The second layer 41Db is formed at a boundary between the space Sp and the semiconductor layer 41A or the semiconductor layer 41C. Next, the third layer 41Dc is formed inside the second layer 41Db. Finally, the first layer 41Da is formed inside the third layer 41Dc.

With such a configuration, it is also possible to achieve an improvement in the speed of an erasure operation similarly to the first embodiment. In addition, the third layer 41Dc suppresses the diffusion of an n-type impurity from the first layer 41Da to the semiconductor layer 61. When the diffusion of an n-type impurity to the semiconductor layer 61 is suppressed, a range in which the first region 61A is formed becomes narrow. When the region of an n$^-$ semiconductor in the first region 61A becomes narrow, the inclination of the energy band in the depletion layer becomes sharper, and the efficiency of generation of the holes h increases.

Second Modification Example

Next, a second modification example of the embodiment will be described.

Figure 20:
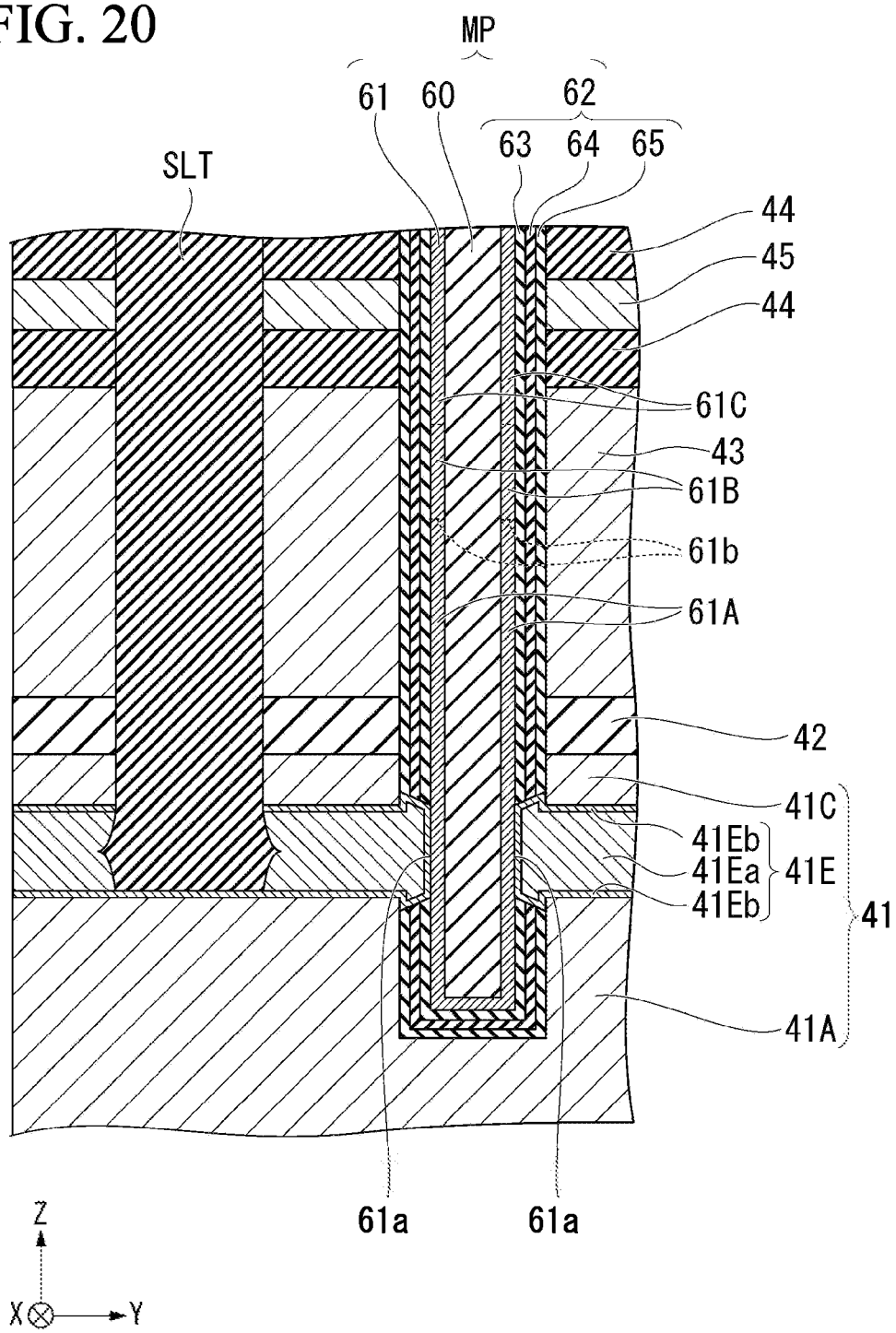
FIG. 20 is an enlarged cross-sectional view illustrating a feature portion of a semiconductor storage device according to a second modification example.

FIG. 20 is an enlarged cross-sectional view illustrating a feature portion of a memory cell array according to the second modification example of first embodiment. In the memory cell array according to the second modification example, the structure of a conductive layer 41 is different from the structure shown in FIG. 8. Components other than those described below are the same as the memory cell array 10 of the first embodiment.

The conductive layer 41 according to the first modification example includes the semiconductor layers 41A, 41E, and 41C. The semiconductor layer 41E includes a first layer 41Ea and a second layer 41Eb. The second layer 41Eb is the same as the second layer 41Bb in FIG. 8.

The first layer 41Ea extends into the XY plane. The first layer 41Ea contains an n-type impurity and a carbon element. The first layer 41Ea contains, for example, phosphorus and carbon. The first layer 41Ea is an n-type semiconductor doped with phosphorus and carbon. The first layer 41Ea is an example of a first portion.

A method of manufacturing a memory cell array according to the first modification example is the same as the manufacturing method shown in the first embodiment. When the first layer 41Ea is formed, the first layer 41Ea is doped with carbon along with an n-type impurity.

With such a configuration, it is also possible to achieve an improvement in the speed of an erasure operation similarly to the first embodiment. In addition, the carbon element applied into the first layer 41Ea suppresses the diffusion of an n-type impurity from the first layer 41Ea to the semiconductor layer 61. When the diffusion of an n-type impurity to the semiconductor layer 61 is suppressed, a range in which the first region 61A is formed becomes narrow. When the region of an n⁻ semiconductor in the first region 61A becomes narrow, the inclination of the energy band in the depletion layer becomes sharper, and the efficiency of generation of the holes h increases.

Third Modification Example

Next, a third modification example of the embodiment will be described.

Figure 21:
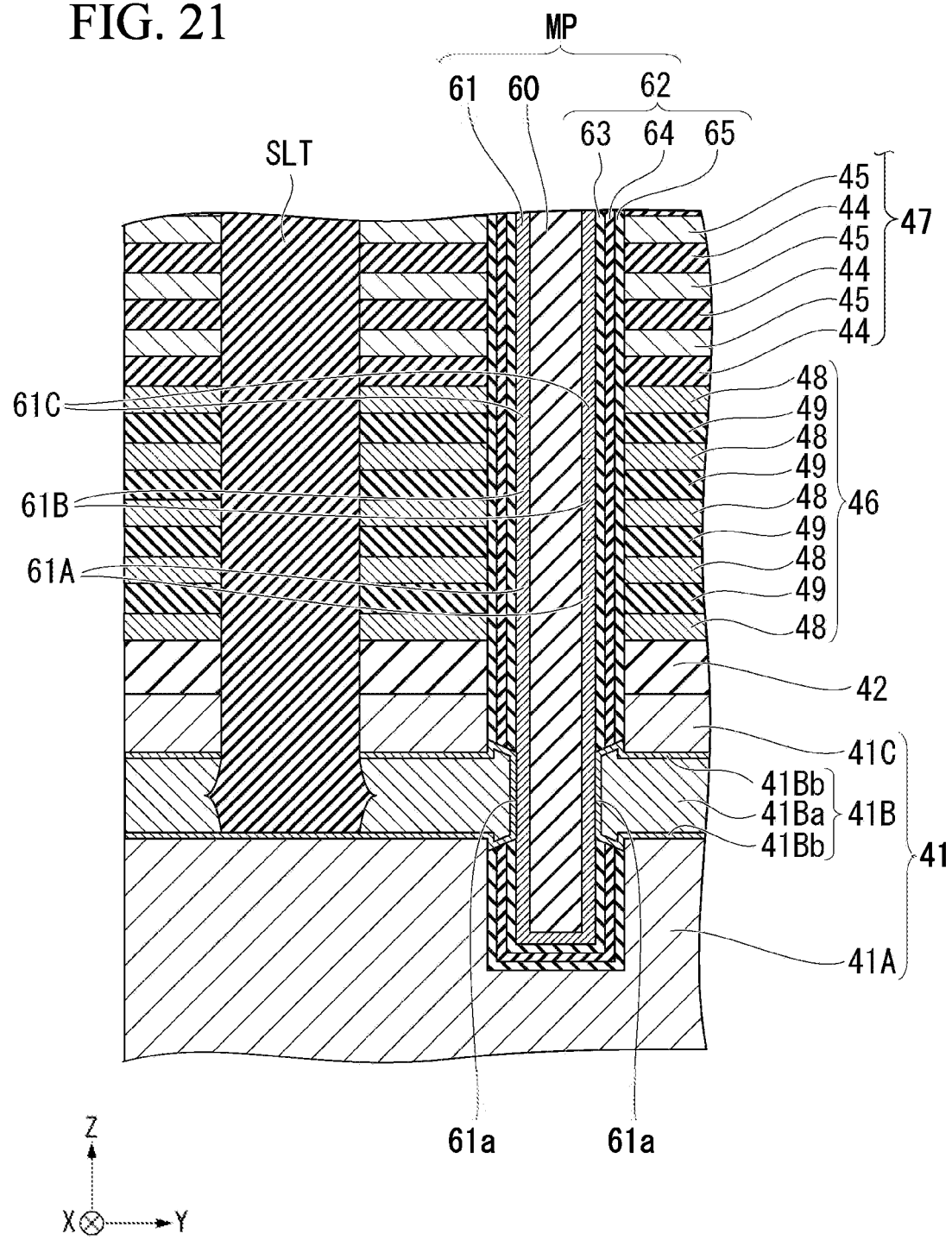
FIG. 21 is an enlarged cross-sectional view illustrating a feature portion of a semiconductor storage device according to a third modification example.

FIG. 21 is an enlarged cross-sectional view illustrating a feature portion of a memory cell array according to the third modification example of the first embodiment. The memory cell array according to the third modification example is different from the structure shown in FIG. 8 in that the conductive layer 43 is replaced with a first stack 46. Components other than those described below are the same as the memory cell array 10 of the first embodiment.

The stack 40 includes the first stack 46 and a second stack 47. The first stack 46 is closer to the conductive layer 41 than the second stack 47. The first stack 46 includes a plurality of conductive layers 48 and a plurality of insulating layers 49, and has the conductive layers 48 and the insulating layers 49 alternately laminated therein. The conductive layer 48 contains, for example, a conductive metal. The conductive metal is, for example, tungsten. The conductive layer 48 may be, for example, polysilicon doped with impurities. The insulating layer 49 contains, for example, a silicon oxide. The second stack 47 includes a plurality of conductive layers 45 and a plurality of insulating layers 44, and has the conductive layers 45 and the insulating layers 44 alternately laminated therein.

There is no clear distinction between structures of the first stack 46 and the second stack 47. The first stack 46 is, for example, a portion ranging from a boundary with the insulating layer 42 in a stack having the first stack 46 and the second stack 47 combined with each other to five conductive layers 48. The plurality of conductive layers 48 of the first stack 46 function as the second selection transistor S2. The plurality of conductive layers 45 of the second stack 47 function as the memory cell transistor MT. The thickness of the semiconductor layer 41C in FIG. 21 is larger than, for example, the thickness of the semiconductor layer 41C in FIG. 8.

A method of manufacturing a memory cell array according to the third modification example is different from the method of manufacturing a memory cell array according to the first embodiment in that, after the insulating layer 42 is formed, the insulating layer 44 and the sacrificial film 85 are alternately laminated without forming the conductive layer 43. The semiconductor layer 41C is made thicker than the semiconductor layer 41C of the memory cell array according to the first embodiment. The semiconductor layer 41C functions as a stopper layer during the formation of the slit SLT and the memory hole MH. A procedure of forming the memory pillar MP, the slit SLT, and the semiconductor layer 41B is the same as the method of manufacturing a memory cell array according to the first embodiment.

With such a configuration, it is also possible to achieve an improvement in the speed of an erasure operation similarly to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing form the spirit of the inventions. The accompanying claims and their equivalents are intended to cover such forms or modifications as would fall within the scope and sprit of the inventions.

EXPLANATION OF REFERENCES

1 Semiconductor memory
10 Memory cell array
30 Substrate
40 Stack
41, 43, 45, 48 Conductive layer
41A, 41B, 41C, 41D, 41E Semiconductor layer
41Ba, 41Da, 41Ea First layer
41Bb, 41db, 41Eb Second layer
41Dc Third layer
42, 44, 49 Insulating layer
46 First stack
47 Second stack
61 Semiconductor layer
61a Boundary
61A, 91A First region
61B, 91B Second region
61C Third region
64 Charge storage film
MP Memory pillar
PE Circuit layer

What is claimed is:

1. A semiconductor storage device, comprising:
a first conductive layer including a first semiconductor layer, a second semiconductor layer, and a third semiconductor layer stacked in order in a first direction;
a stack disposed above the first conductive layer and including a plurality of second conductive layers stacked in the first direction; and
a columnar body that extends in the first direction through the stack, and includes a fourth semiconductor layer and a charge storage film disposed between the plurality of second conductive layers and the fourth semiconductor layer,
the first conductive layer is in contact with the fourth semiconductor layer,
the fourth semiconductor layer includes a first region in which a concentration of an n-type impurity is higher than a concentration of a p-type impurity, a second region in which a concentration of the p-type impurity is higher than a concentration of the n-type impurity, and a third region in contact with the second semiconductor layer and disposed closer to the first region than the second region in the first direction,
the second semiconductor layer includes a first portion, a second portion, and a third portion,
the first portion contains the n-type impurity,
the second portion contains the p-type impurity,
the third portion contains a carbon element, and at least a portion of the second portion is disposed between the first portion and the fourth semiconductor layer, and at least a portion of the third portion is disposed between the first portion and the second portion.

2. The semiconductor storage device according to claim 1, wherein the first region extends from a boundary between the second semiconductor layer and the fourth semiconductor layer in the first direction.

3. The semiconductor storage device according to claim 1, wherein the fourth semiconductor layer further includes a fourth region, and the fourth region does not contain the n-type impurity and the p-type impurity or has a lower concentration of the p-type impurity and the n-type impurity than the second region.

4. The semiconductor storage device according to claim 1, wherein a concentration of the n-type impurity at a boundary between the second semiconductor layer and the fourth semiconductor layer is higher than a concentration of the n-type impurity at a boundary between the first region and the second region.

5. The semiconductor storage device according to claim 1, wherein the concentration of the n-type impurity of the fourth semiconductor layer decreases with distance from a boundary between the second semiconductor layer and the fourth semiconductor layer in the first direction.

6. The semiconductor storage device according to claim 1, wherein the concentration of the p-type impurity of the fourth semiconductor layer decreases with distance from a boundary between the second semiconductor layer and the fourth semiconductor layer in the first direction.

7. The semiconductor storage device according to claim 1, wherein the first portion further contains a carbon element.

8. The semiconductor storage device according to claim 1, the second region is in a same level of a lowermost layer of the plurality of second conductive layers.

9. The semiconductor storage device according to claim 1, wherein the stack includes a first stack and a second stack, the first stack disposed closer to the first conductive layer than the second stack, and the second region is in a same level of the first stack.

10. The semiconductor storage device according to claim 1, wherein the first region is an n-type semiconductor.

11. The semiconductor storage device according to claim 1, wherein the second region is a p-type semiconductor.

12. The semiconductor storage device according to claim 1, wherein the n-type impurity contains phosphorus.

13. The semiconductor storage device according to claim 1, wherein the p-type impurity contains boron.

14. The semiconductor storage device according to claim 1, wherein the stack is disposed on a logic circuit.

* * * * *